(12) United States Patent
Lee

(10) Patent No.: US 9,012,889 B2
(45) Date of Patent: Apr. 21, 2015

(54) FIELD EFFECT TRANSISTOR USING GRAPHENE, PHOSPHORUS-DOPED GRAPHENE, AND METHODS OF PRODUCING THE SAME

(71) Applicant: Research & Business Foundation Sungkyunkwan University, Suwon-si (KR)

(72) Inventor: Hyoyoung Lee, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 13/960,996

(22) Filed: Aug. 7, 2013

(65) Prior Publication Data

US 2014/0145148 A1    May 29, 2014

(30) Foreign Application Priority Data

Nov. 28, 2012  (KR) .................. 10-2012-0136477

(51) Int. Cl.
*H01L 29/775* (2006.01)
*H01L 29/66* (2006.01)

(52) U.S. Cl.
CPC ........ *H01L 29/775* (2013.01); *H01L 29/66477* (2013.01)

(58) Field of Classification Search
CPC .............. H01L 29/1606; H01L 29/775; H01L 29/66477
See application file for complete search history.

(56) References Cited

U.S. PATENT DOCUMENTS

| | | | |
|---|---|---|---|
| 2010/0102292 A1* | 4/2010 | Hiura et al. | 257/9 |
| 2012/0058350 A1* | 3/2012 | Long et al. | 428/446 |
| 2012/0068152 A1 | 3/2012 | Hwang et al. | |
| 2012/0168722 A1* | 7/2012 | Chung et al. | 257/29 |
| 2012/0228556 A1 | 9/2012 | Roundhill | |
| 2012/0256167 A1* | 10/2012 | Heo et al. | 257/27 |
| 2013/0171452 A1* | 7/2013 | Goela et al. | 428/408 |

FOREIGN PATENT DOCUMENTS

| | | |
|---|---|---|
| JP | 4669957 B2 | 4/2011 |
| KR | 10-2010-0111999 | 10/2010 |

OTHER PUBLICATIONS

Some, Surajit, et al. "Highly Air-Stable Phosphorus-Doped n-Type Graphene Field-Effect Transistors." Advanced Materials 24.40 (2012): 5481-5486.

* cited by examiner

*Primary Examiner* — Whitney T Moore
(74) *Attorney, Agent, or Firm* — NSIP Law

(57) ABSTRACT

A field effect transistor using a channel layer including a phosphorus-doped graphene and a method of fabricating the same are provided. Further, a phosphorus-doped graphene and a method of producing the same are provided. The field effect transistor includes: a source electrode and a drain electrode formed on a substrate; and a channel layer comprising a phosphorus-doped graphene, the channel layer electrically connected to the source electrode and the drain electrode.

25 Claims, 36 Drawing Sheets

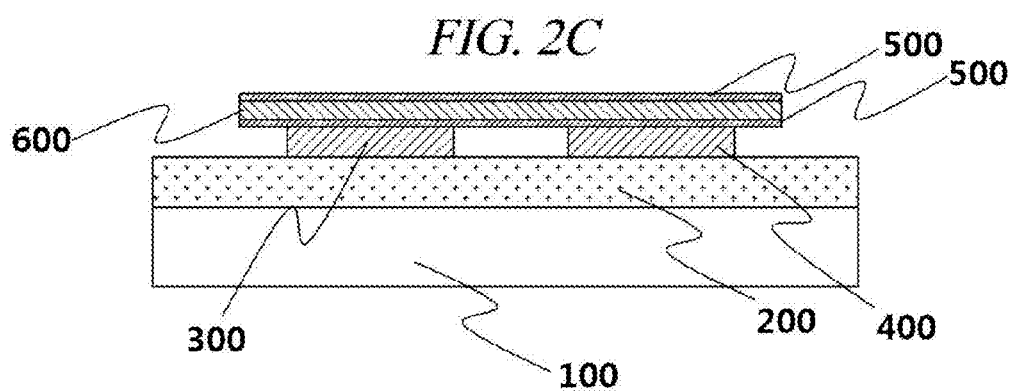

FIELD EFFECT TRANSISTOR USING GRAPHENE, PHOSPHORUS-DOPED GRAPHENE, AND METHODS OF PRODUCING THE SAME

CROSS-REFERENCE TO RELATED APPLICATION

This application claims the benefit under 35 U.S.C. §119 (a) of Korean Patent Application No. 10-2012-0136477 filed on Nov. 28, 2012, in the Korean Intellectual Property Office, the entire disclosure of which is incorporated herein by reference for all purposes.

BACKGROUND

1. Field

The following description relates to a field effect transistor including phosphorus-doped graphene and a production method thereof, and phosphorus-doped graphene and a method of producing the same.

2. Description of Related Art

A graphene is a molecule having the structure of a 2-dimensional honeycomb lattice monolayer composed of carbon atoms. Graphene exhibits excellent properties such as high thermal conductivity (~5000 $Wm^{-1}K^{-1}$), high mobility of electric charge carriers (200,000 $cm^2V^{-1} s^{-1}$), large specific surface area (2,630 $m^2 g^{-1}$) and high mechanical stability. Due to these excellent properties, since its first discovery in 2004, a great deal of attention has been paid by researchers to explore the possible application of graphene to various fields. By way of example, graphene application has been considered for a wide range of applications, including a field effect transistor (FET), a supercapacitor, a hydrogen generation/storage, a solar cell, a photocatalyst, a biosensor, to name a few.

Graphene is particularly attracting attention as an available candidate material for future electronics. As the Si-based electronics is expected to meet a problem of size limit, development of a new material capable of replacing Si is strongly desirable. Graphene has advantageous properties such as ballistic transport of charges on nano scale, and graphene can be deeply doped by gate voltage or molecular adsorption without suffering a great loss in carrier mobility. The superlative electric transfer characteristics of the graphene may be controlled by selecting a doping source with discretion and adjusting the amount of doping.

In this regard, Korean Patent No. 2010-0111999 discloses a field effect transistor using graphene as a channel layer.

Further, since it is first reported by K. S. Novoselov and A. K. Geim in a paper titled "Two-dimensional gas of massless Dirac fermions in graphene" (Nature, vol. 438, p. 197, 2005) that graphene has an electric transfer characteristic that is switchable between electron and hole channels by means of varying a gate voltage, many research groups have studied controlling the electrical characteristics of the graphene for the purpose of its application to electronics. Some researches considered using $NO_2$, $H_2O$ and iodine as acceptors, whereas using $NH_3$, CO and ethanol as donors. Graphene shows a P-type (hole conductor) electric transfer characteristic curve when it is doped with acceptor molecules. However, graphene also shows an N-type (electron conductor) electric transfer characteristic curve when it is doped with donor molecules. Since graphene may exhibit both the N-type conductivity and the P-type conductivity characteristics by being doped with atoms capable of giving or receiving electrons easily, the width of its research and the range of its application are deemed to be very wide. In general, a graphene semiconductor channel exhibits P-type conductivity characteristics in the oxygen atmosphere or in the air by being doped with oxygen. Besides, even an N-type graphene semiconductor channel tends to be easily converted to a P-type channel in exposure to the air by being doped with oxygen. However, in order to develop a complementary circuit graphene device in which a P-type transistor and an N-type transistor coexists, it is very important to develop an N-type graphene semiconductor channel in which the N-type conductivity characteristics can be stably maintain and maximized in exposure to the air.

Researches that used doping and a complex in order to maximize either the N-type conductivity characteristics or the P-type conductivity characteristics have been reported. Further, test results regarding the stability of a P-type graphene semiconductor device have also been reported. So far, however, a graphene semiconductor channel device that is stable when exposed to the air and is capable of maintaining a P-type characteristic for a long time has yet to be reported.

Further, there is a strong demand for developing a method capable of maintaining the N-type conductivity characteristics of a graphene stably in exposure to the air.

SUMMARY

In one general aspect, there is provided a field effect transistor, including: a source electrode and a drain electrode disposed on a substrate; and a channel layer comprising a phosphorus-doped graphene, the channel layer electrically connected to the source electrode and the drain electrode.

The general aspect of the field effect transistor further includes an oxide film disposed between the substrate and the channel layer.

The channel layer may be obtained by performing doping on a graphene material using one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine [$R_2PPR_2$, $R_2P(CH_2)_nPR_2$], diphosphene(HP=PH), diphosphenes(R—P=P—R), phosphine oxide($R_3P$=O), phosphorane($PR_5$, $R_3P$=$CR_2$), phosphinite[P(OR)$R_2$], phosphonite [P(OR)$_2$R], phosphate[P(OR)$_3$], phosphinate[$R_2P$ (RO)O], phosphonate[RP(RO)$_2$O], phosphate[P(RO)$_3$O], and their combinations as a precursor.

The channel layer may be obtained by performing phosphorus doping between double layers of a graphene film.

A content of phosphorus in the phosphorus-doped graphene may be 0.1 wt % or greater and 30 wt % or less.

The source electrode and the drain electrode independently may include one selected from the group consisting of Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and their combinations.

The substrate may include silicon, glass, or quartz.

The substrate may include a flexible substrate, a transparent substrate, or a flexible and transparent substrate.

In another general aspect, there is provided a method of producing a field effect transistor, involving: forming a source electrode and a drain electrode on a substrate; forming a channel layer including a phosphorus-doped graphene, the channel layer electrically connected to the source electrode and the drain electrode.

The general aspect of the method may further involve forming an oxide film on the substrate before forming the channel layer.

The general aspect of the method may further involve forming the channel layer by doping a graphene material with one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_nPP_2$], diphosphene(HP=PH), diphosphenes(R—P=P—R), phosphine oxide($R_3P$=O), phosphorane($PR_5$, $R_3P$=$CR_2$), phosphinite[P(OR)$R_2$], phosphonite[P(OP)$_2$R], phosphate[P(OR)$_3$], phosphinate[$R_2P$(RO)O], phosphonate[RP(RO)$_2$O], phosphate[P(RO)$_3$O], and their combinations as a precursor.

The general aspect of the method may further involve doping a graphene material to obtain the phosphorus-doped graphene, wherein the doping is performed between double layers of a graphene film.

A content of phosphorus in the phosphorus-doped graphene may be 0.1 wt % or greater and 30 wt % or less.

The source electrode and the drain electrode independently may include one selected from the group consisting of Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and their combinations.

The substrate may include silicon, glass, or quartz.

The substrate may include a flexible substrate or a transparent flexible substrate.

In another general aspect, there is provided a method of preparing a phosphorus-doped graphene, involving: injecting a precursor including a phosphorus compound into a graphene material, wherein the phosphorus compound is in a gas phase, a liquid phase, or a state of being dissolved in a solvent; and heating the precursor-injected graphene material.

The graphene material may include a graphene manufactured by chemical vapor deposition method, a graphene oxide, or a reduced graphene oxide.

The phosphorus compound may include one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P$=O), phosphorane($PR_5$, $R_3P$=$CR_2$), phosphinite[P(OR)$R_2$], phosphonite[P(OR)$_2$R], phosphate[P(OR)$_3$], phosphinate[$R_2P$(RO)O], phosphonate[RP(RO)$_2$O], phosphate[P(RO)$_3$O], and their combinations.

In another general aspect, there is provided a phosphorus-doped graphene prepared by the method described above.

Other features and aspects may be apparent from the following detailed description, the drawings, and the claims.

BRIEF DESCRIPTION OF THE DRAWINGS

FIG. 2C is a schematic diagram of an example of a manufactured field effect transistor.

FIG. 4A is a Raman spectrum of an example of a double-layer graphene.

FIG. 4B is a Raman spectrum of an example of a phosphorus-doped double-layer graphene before thermal annealing.

FIGS. 5A and 5B show a change in Raman spectrum after phosphorus-doping and thermal annealing; FIG. 5C shows a change in the position of graph peaks at respective thermal annealing temperatures; and FIG. 5D provides comparison of peak positions after phosphorus doping and nitrogen doping, respectively.

FIG. 6A illustrates an electron transfer characteristic ($I_d$-$V_g$) of a nitrogen-doped monolayer field effect transistor measured in the air, and FIG. 6B illustrates an electron transfer characteristic ($I_d$-$V_g$) of a phosphorus-doped monolayer field effect transistor measured in the air.

FIG. 7A shows an electron transfer characteristic ($I_d$-$V_g$) measured in the air after the field effect transistor is left in the air for about 30 days and FIG. 7B shows an electron transfer characteristic ($I_d$-$V_g$) measured in vacuum.

Figure 1A:
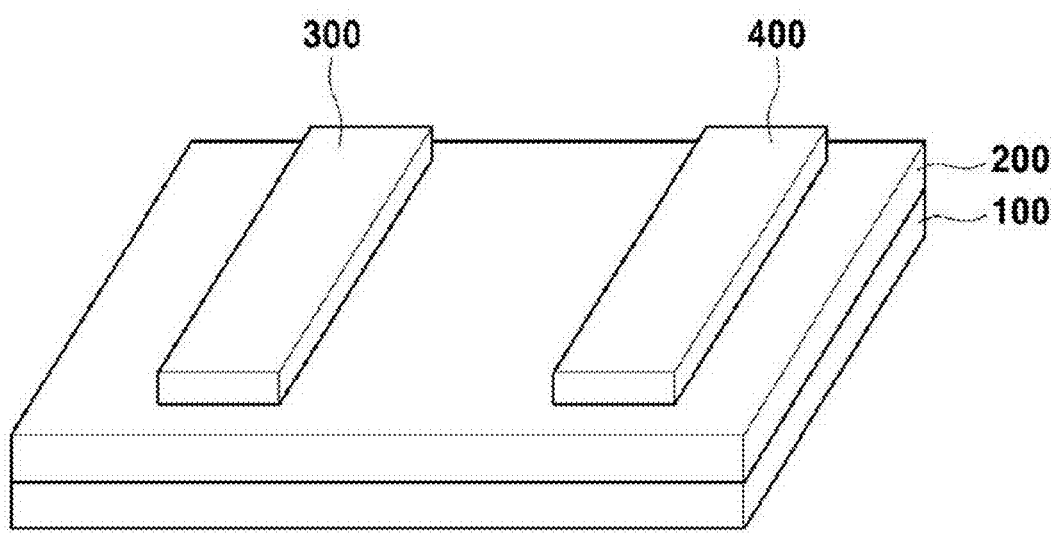
FIGS. 1A to 1C are schematic diagrams for illustrating an example of a manufacturing process of a field effect transistor in accordance with a general aspect of the present disclosure.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Through the whole document, the terms "connected to" or "coupled to" are used to designate a connection or coupling of one element to another element and include both a case where an element is "directly connected or coupled to" another element and a case where an element is "electronically connected or coupled to" another element via still another element.

Through the whole document, the term "on" that is used to designate a position of one element with respect to another element includes both a case that the one element is adjacent to the another element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from the group consisting of components, steps, operation and/or elements described in Markush type and thereby means that the disclosure includes one or more components, steps, operations and/or elements selected from the Markush group.

Through the whole document, the term "A and/or B" means "A or B, or A and B".

Hereinafter, various examples of the present disclosure will be described in detail with reference to the accompanying drawings. However, it should be noted that the present disclosure may not be limited thereto.

Described below are various examples of graphene semiconductor channel devices that are stable in the air and are capable of maintaining its N-type characteristic for a long time by using a phosphorus-doped graphene, and various examples of method of preparing such a graphene semiconductor channel device. Further described below are various examples of phosphorus-doped graphene films, and methods of preparing the same.

While various limitations of current technology overcome by the present disclosure are described above, and while some examples described below address some of the limitations, the present disclosure is not limited to thereto.

Described below are various examples of field effect transistors formed by using a channel layer including the phosphorus-doped graphene that exhibits an N-type semiconductor characteristic superior to that of a nitrogen-doped graphene semiconductor device. Furthermore, described below are examples of field effect transistors having a channel layer including the phosphorus-doped graphene that is stable in the air for a long time.

With the disclosure of various examples of field effect transistors formed by using a channel layer including phosphorus-doped graphene that is stable in the air and that exhibits an excellent N-type semiconductor characteristic, the present disclosure is expected to contribute to the development of a complementary circuit graphene logical element in which a P-type semiconductor channel transistor and an N-type semiconductor channel transistor coexist.

In accordance with a first aspect of the present disclosure, there is provided a field effect transistor including: a source electrode and a drain electrode respectively formed on a substrate; and a channel layer including a phosphorus-doped graphene, wherein the channel layer is electrically connected to the source electrode and the drain electrode.

A field effect transistor in accordance with an example of the present disclosure may be formed through a manufacturing process as illustrated in FIGS. 1A to 1C and FIG. 2C. Hereinafter, referring to FIGS. 1A to 1C and FIG. 2C, an example of a field effect transistor according to the present disclosure will be described in detail.

First, referring to FIG. 1A, a source electrode 300 and a drain electrode 400 may be respectively formed on a substrate 100. The substrate 100 may be a substrate generally used for a semiconductor device. By way of example, the substrate may be, but not limited to, a transparent inorganic material substrate including glass, quartz, $Al_2O_2$, SiC, MgO, or the like; a transparent flexible organic material substrate including polyethyleneterephthalate (PET), polystyrene (PS), polyimide (PI), polyvinyl chloride (PVC), polyvinyl pyrrolidone (PVP), polyethylene (PE), or the like; or a substrate including Si, Ge, GaAs, InP, InSb, InAs, AlAs, AlSb, CdTe, ZnTe, ZnS, CdSe, CdSb, GaP, or the like. For example, if a plastic substrate such as PET is used, a flexible electronic device may be manufactured.

According to an example, the substrate may include silicon, glass or quartz. However, the material for forming the substrate is not limited thereto.

The substrate may be a flexible substrate or a transparent substrate, but the material for the substrate is not limited thereto. In an example, the substrate may have a thickness of approximately 0.1 mm to 3 mm, or about 0.1 mm to 1 mm. However, the thickness may vary depending on the application of the field effect transistor.

An oxide film 200 may be formed on the substrate 100. The oxide film may be formed to have a thickness equal to or less than, e.g., about 50 nm. However, the thickness of the oxide film 200 is not limited thereto. The thickness of the oxide film 200 may be adjusted as required. By way of example, the thickness of the oxide film 200 may be equal to or less than about 50 nm, equal to or less than about 40 nm, equal to or less than about 30 nm, equal to or less than about 20 nm, equal to or less than about 10 nm, between about 10 nm and about 50 nm inclusive, between about 10 nm and about 40 nm inclusive, between about 10 nm and about 30 nm inclusive, between about 10 nm and about 20 nm inclusive, between about 20 nm and about 50 nm inclusive, between about 30 nm and about 50 nm inclusive, or between about 40 nm and about 50 nm inclusive.

The source electrode 300 and the drain electrode 400 formed on the substrate 100 may include a conductive material. By way of non-limiting example, they may include polysilicon or ITO (Indium Tin Oxide). However, the material for the source electrode 300 is not limited thereto. Further, the source electrode and the drain electrode may include a metal, but may not be limited thereto.

According to an example of the present disclosure, each of the source electrode and the drain electrode may independently include one selected from the group consisting of Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and their combinations. However, the material is not limited thereto. By way of example, the source electrode and the drain electrode may be formed by a deposition method such as, chemical vapor deposition (CVD), plasma enhanced CVD (PECVD), low pressure CVD (LPCVD), physical vapor deposition (PVD), sputtering or atomic layer deposition (ALD), or the like. However, the methods of forming the electrodes are not limited thereto.

Figure 1B:
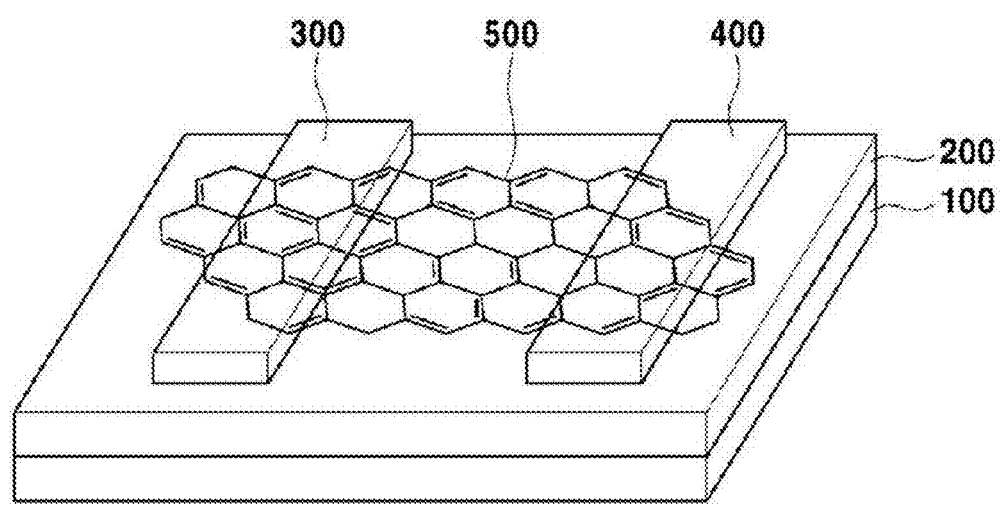

Subsequently, as illustrated in FIG. 1B, a graphene channel layer 500 is formed so as to be electrically connected to the source electrode 300 and the drain electrode 400. The distance between the source electrode 300 and the drain electrode 400 may range from 0.1 mm to 1000 mm, or 0.1 mm to 5 mm. However, the distance is not limited thereto.

The graphene channel layer 500 may be formed by being prepared at another substrate and then transferred onto an upper surface of the substrate 100 from the another substrate. However, the method of obtaining the graphene channel layer 500 is not limited thereto. For example, a transferable flake sample, a reduced graphene oxide or the like may be used as the graphene channel layer, but the type of graphene layer is not limited thereto. The graphene channel 500 may be formed to have a monolayer, double layers or multiple layers of graphene, but the graphene channel 500 is not limited thereto. The graphene channel layer 500 may be directly grown on the substrate, but the method of obtaining the graphene channel layer 500 is not limited thereto. Material that contains graphene, graphene oxide, reduced graphene oxide, graphene flakes and the like that may be doped to produce a doped graphene or doped graphene film, or the precursor of the graphene film for forming the graphene channel layer 500 may be referred to as a graphene material.

As for a process for forming the graphene channel layer 500, a monolayer CVD graphene may be formed by a method disclosed in Document [X. Li, W. W. Cai, J. An, S. Kim, J. Nah, D. Yang, R. Piner, A. Velamakanni, I. Jung, E. Tutuc, S. K. Banerjee, L. Colombo, R. S. Ruoff, Science, 324, 1312, 2009] and then may be moved onto a FET device. However, the process that may be used is not limited thereto.

A graphene film formed in accordance with the present disclosure may be used as a biosensor, a transparent electrode material, a flexible electrode material, a memory device, a tertiary non-linear optical device, a counter electrode plate material, or the like. However, the application thereof is not limited thereto.

The graphene film formed by the aforementioned method may have a large area having a transversal and/or a longitudinal length ranging from about 1 mm to about 1000 m, but the area is not limited thereto. Further, the graphene film may include a monolayer or multiple layers. Desirably, the graphene film may be formed as double layers, but the layer arrangement is not limited thereto. The graphene film may have a uniform structure with substantially no defect.

Figure 1C:
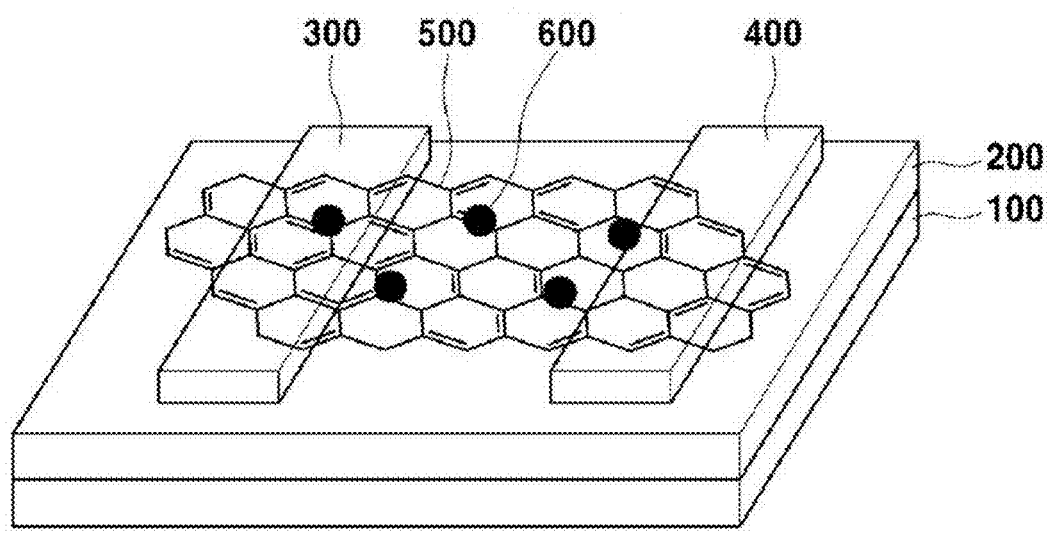

Thereafter, as illustrated in FIG. 1C, phosphorus doping 600 may be performed at various locations on the graphene channel layer 500 to insert phosphorus atoms into the molecular structure of the graphene film. Otherwise, as shown in FIG. 2C, phosphorus doping 600 may be performed between graphene double layers. Each graphene layer of the double-layered graphene film may have a thickness of approximately 2 angstroms (?) to 0.1 nm, and may be composed of 1-10 (?) sheets of graphene molecules, for example. However, the thickness of each layer is not limited thereto. Phosphorus doping 600 introduces extra electrons, tending to render N-type conductivity characteristics to the graphene molecule.

According to an example, the phosphorus-doping may be performed by using, as a precursor, one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P$=O), phosphorane($PR_5$, $R_3P$=$CR_2$), phosphinite[P(OR)$R_2$], phosphonite[P(OR)$_2$R], phosphate[P(OR)$_3$], phosphinate [$R_2$P (RO)O], phosphonate[RP(RO)$_2$O], phosphate[P(RO)$_3$O], and their combinations. However, the precursor material is not limited thereto. By way of example, the precursor may include a phosphorus compound in a gas state, a liquid state or in a state of being dissolved in a solvent, but the precursor material is not limited thereto.

According to an example, the phosphorus-doping may be formed between double layers of the graphene, but the method of doping is not limited thereto.

According to an example, a content of the phosphorus in the graphene film due to the phosphorus-doping may range from, but may not be limited to, about 0.1 wt % to about 30 wt %. By way of example, the content of the phosphorus-doping may be in the range of, e.g., about 0.1 wt % to about 30 wt %, about 0.5 wt % to about 30 wt %, about 1 wt % to about 30 wt %, about 5 wt % to about 30 wt %, about 10 wt % to about 30 wt %, about 15 wt % to about 30 wt %, about 20 wt % to about 30 wt %, about 25 wt % to about 30 wt %, about 0.1 wt % to about 25 wt %, about 0.1 wt % to about 20 wt %, about 0.1 wt % to about 15 wt %, about 0.1 wt % to about 10 wt %, about 0.1 wt % to about 5 wt %, about 0.1 wt % to about 1 wt %, or about 0.1 wt % to about 0.5 wt %. However, the concentration of phosphorus is not limited thereto.

A graphene is a zero band gap material, and a Fermi level of the graphene is typically about −4.42 eV. In a graphene field effect transistor to which a gate voltage is applied, due to an electronic field effect, the graphene is converted to an electron or a hole conductor through a mixed state where electrons and holes exist. On an electron transfer characteristic curve [current-gate voltage ($I_{ds}$–$V_{gs}$) curve] of the graphene FET, a gate voltage and a minimum current are a Dirac voltage and a Dirac point(DP). At the Dirac point, the holes and the electrons in the graphene exhibit the same carrier mobility. The graphene channel exhibits a hole conductor behavior like a P-type semiconductor at a gate voltage lower than the Dirac voltage. On the contrary, the graphene channel shows an electron conductor characteristic like an N-type semiconductor at a gate voltage higher than the Dirac voltage.

The N-type semiconductor-like behavior may be obtained not only by substituting carbon atoms on a graphene frame with relevant atoms but also by donation ability of lone pairs to the system network.

Figure 2A:
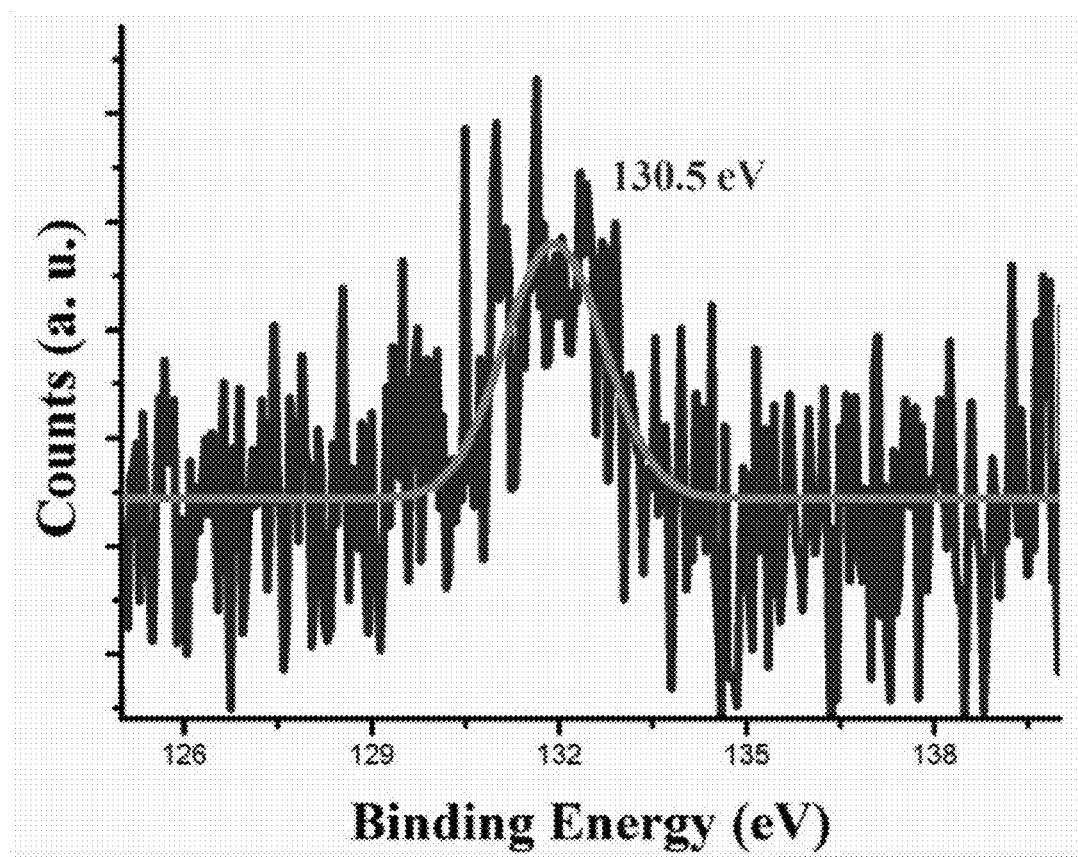
FIG. 2A illustrates a P2p XPS spectrum of an example of an electric field effect transistor.
Figure 2B:
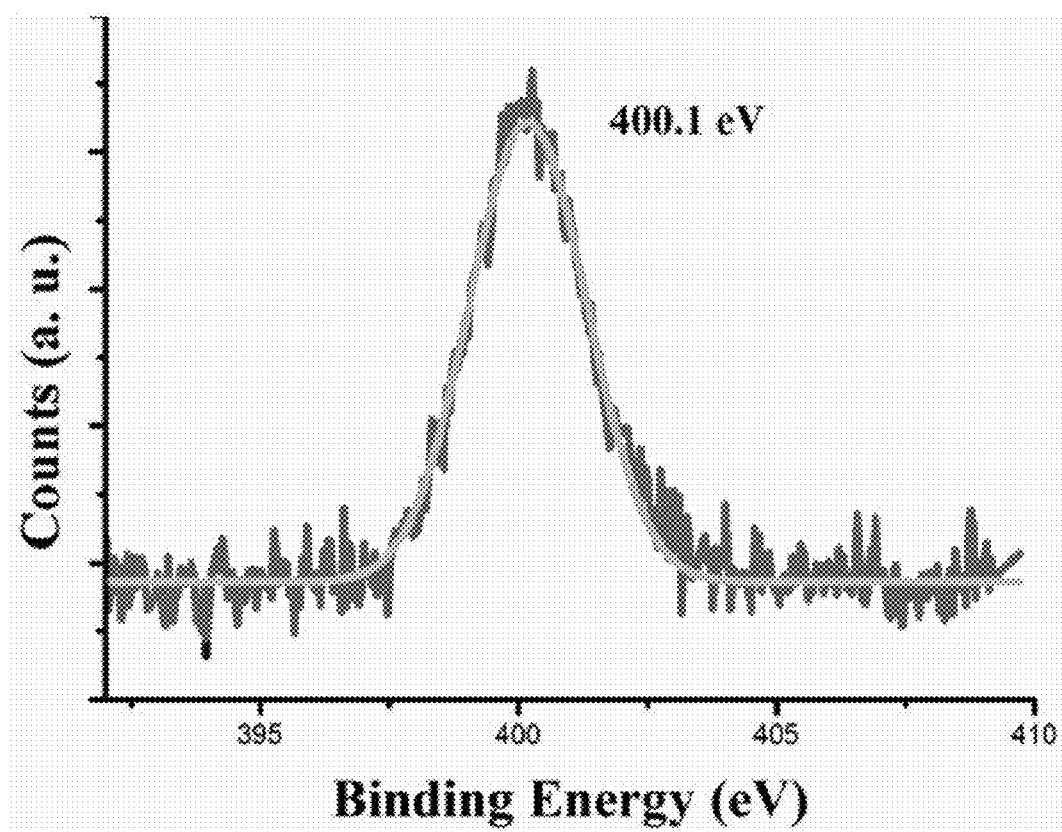
FIG. 2B illustrates a N 1s XPS spectrum of the example of the electric field effect transistor of FIG. 2A.
Figure 2D:
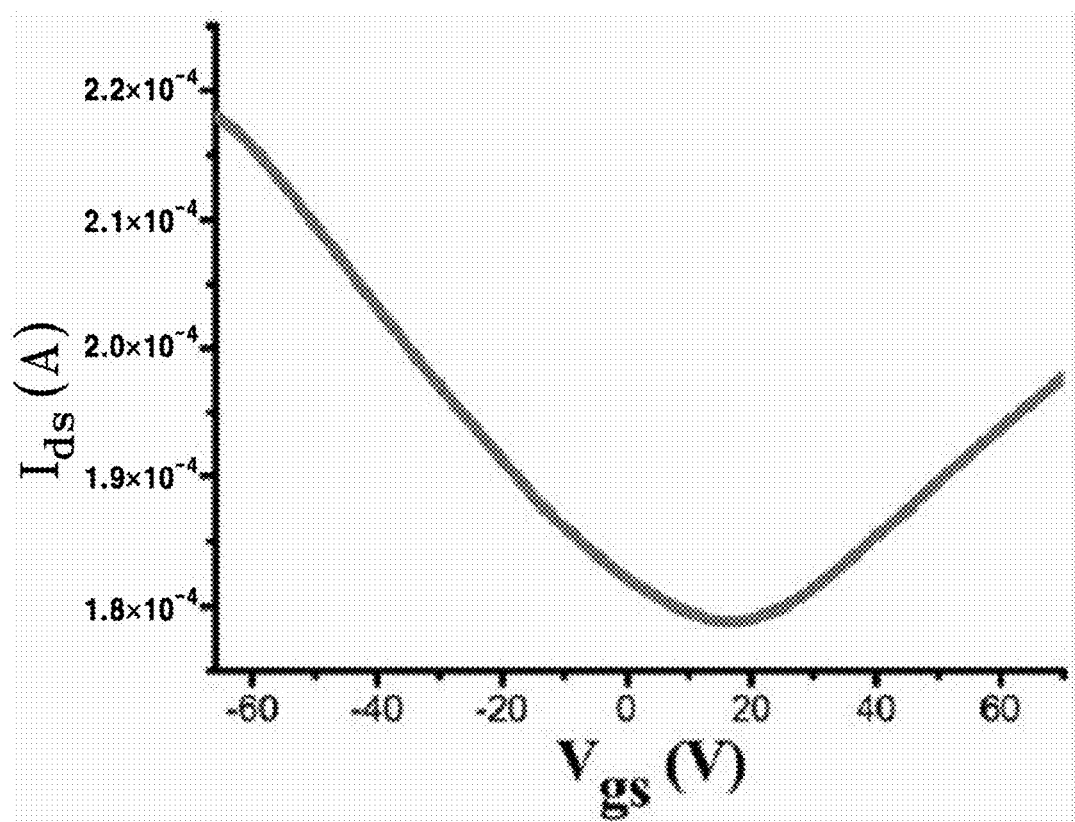
FIGS. 2D and 2E illustrate electron transfer characteristics of graphene before thermal annealing in both cases when the graphene is doped with nitrogen and phosphorus, respectively.
Figure 2E:
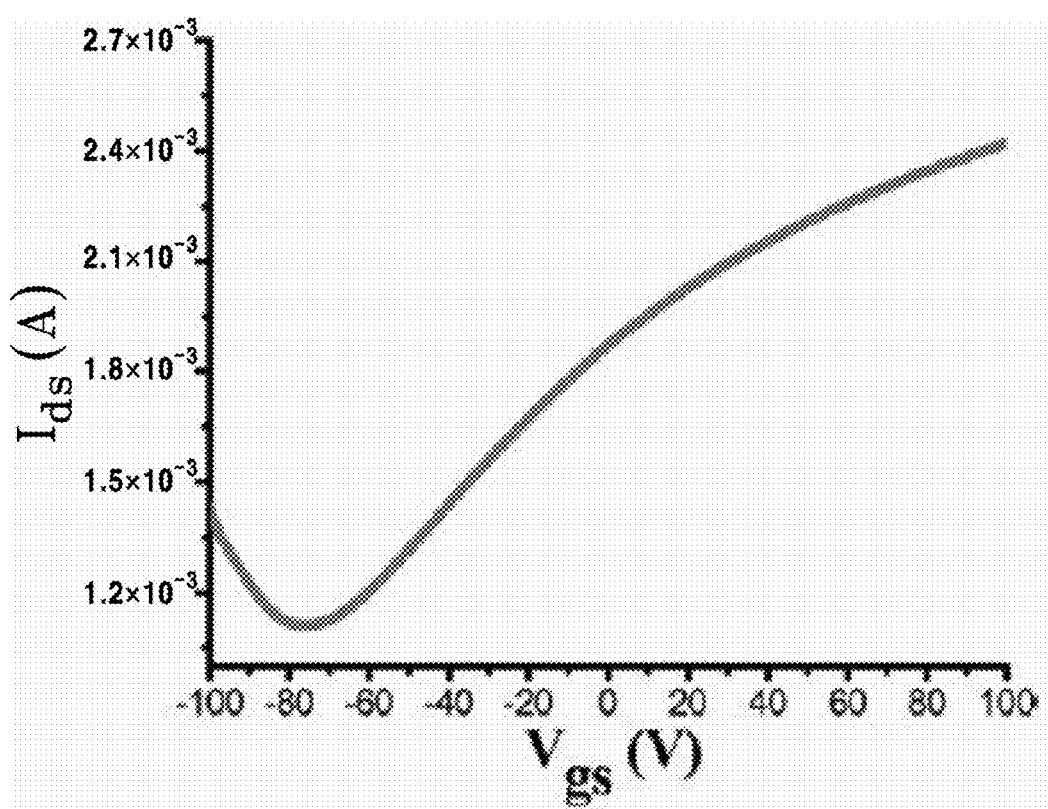
Figure 2F:
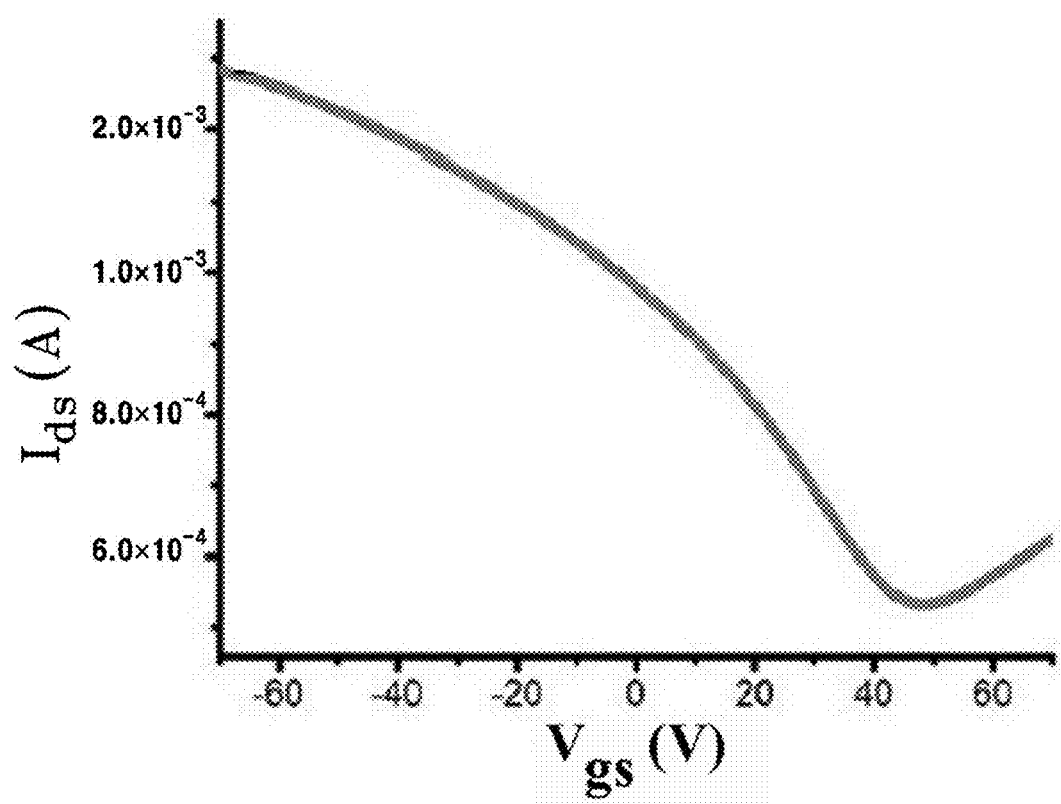
FIGS. 2F and 2G illustrate electron transfer characteristics ($I_d$-$V_g$) of a monolayer graphene and a double-layer graphene, respectively, when no doping material is added.
Figure 2G:
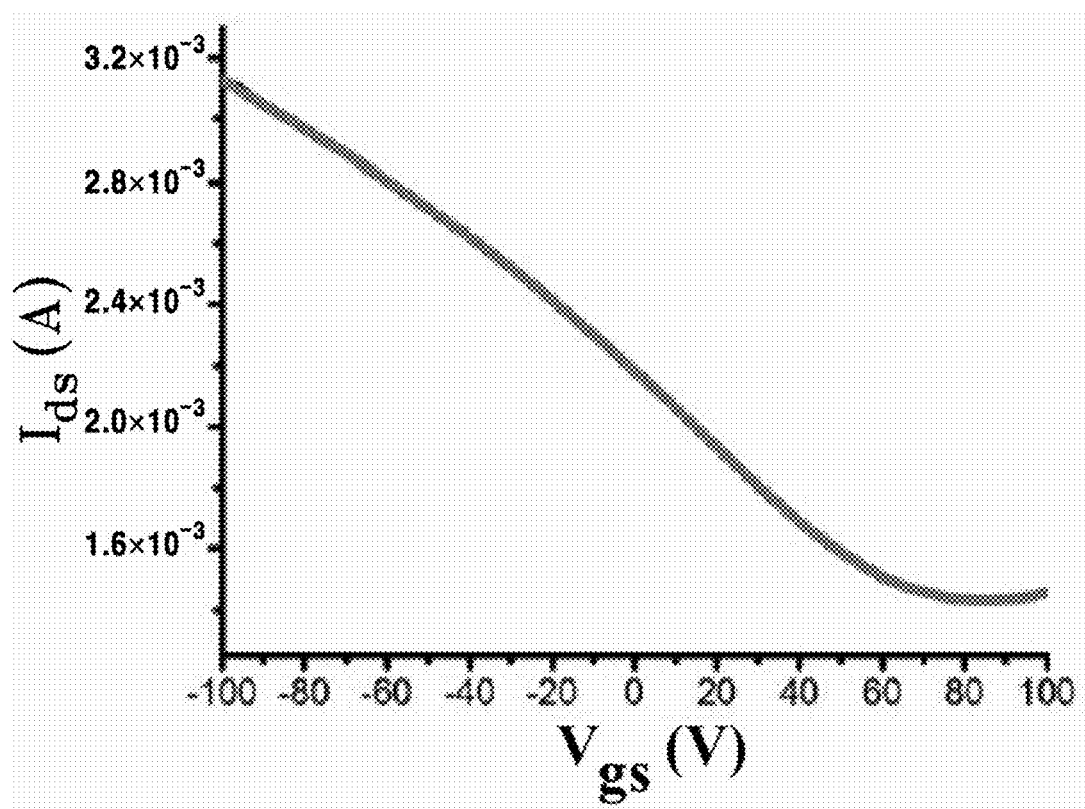
Figure 3A:
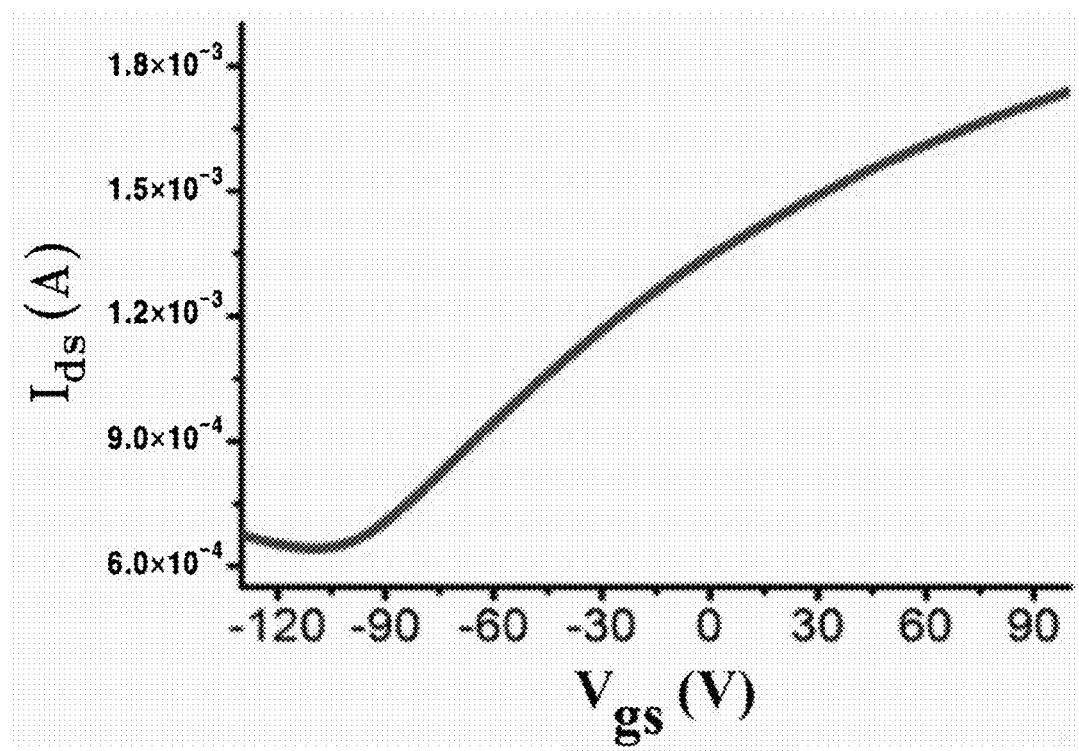
FIGS. 3A to 3H illustrate electron transfer characteristics ($I_d$-$V_g$) of an example of a phosphorus-doped field effect transistor and an example of a nitrogen-doped field effect transistor obtained after thermal annealing is performed at various temperatures.
Figure 3B:
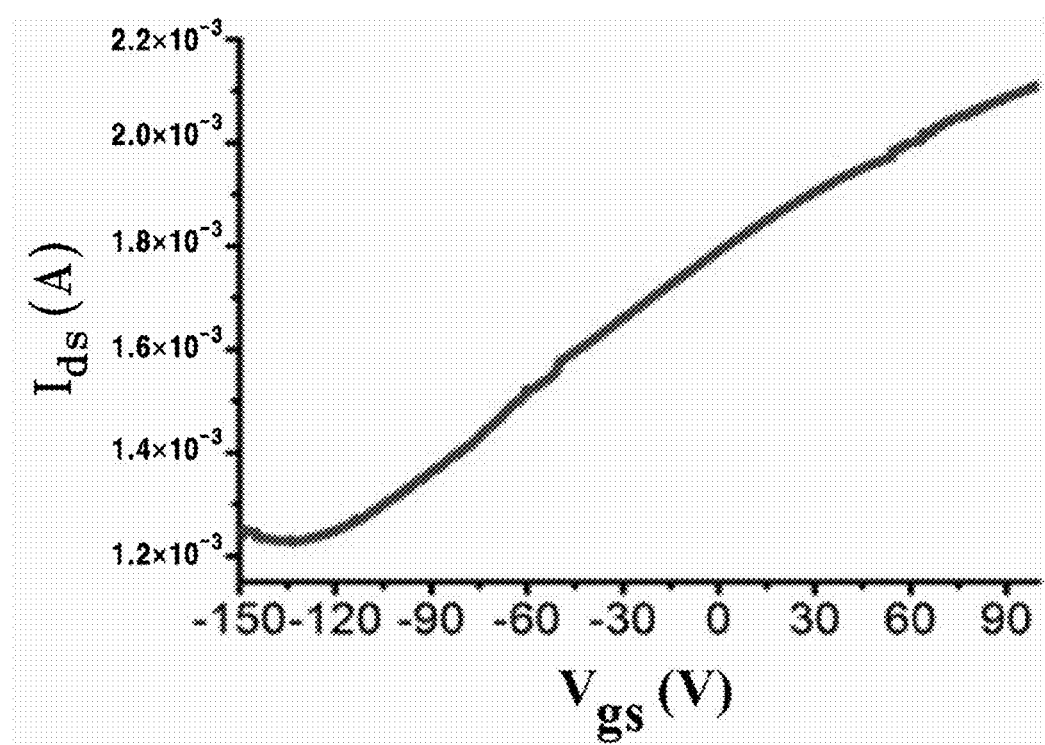
Figure 3C:
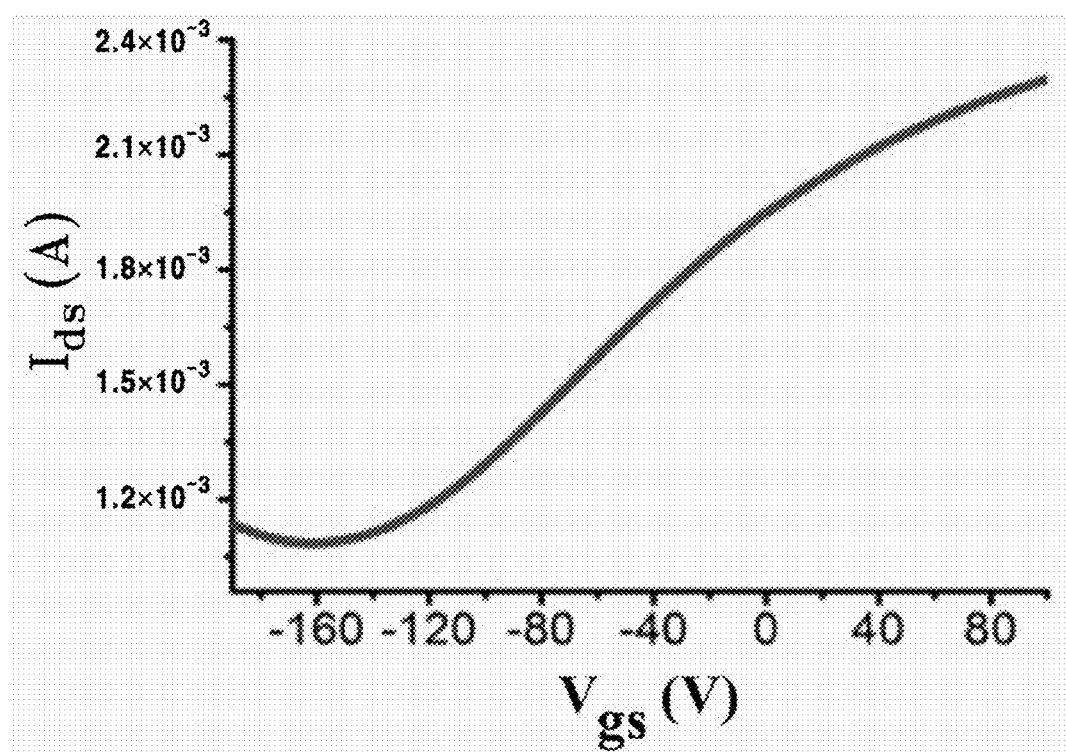
Figure 3D:
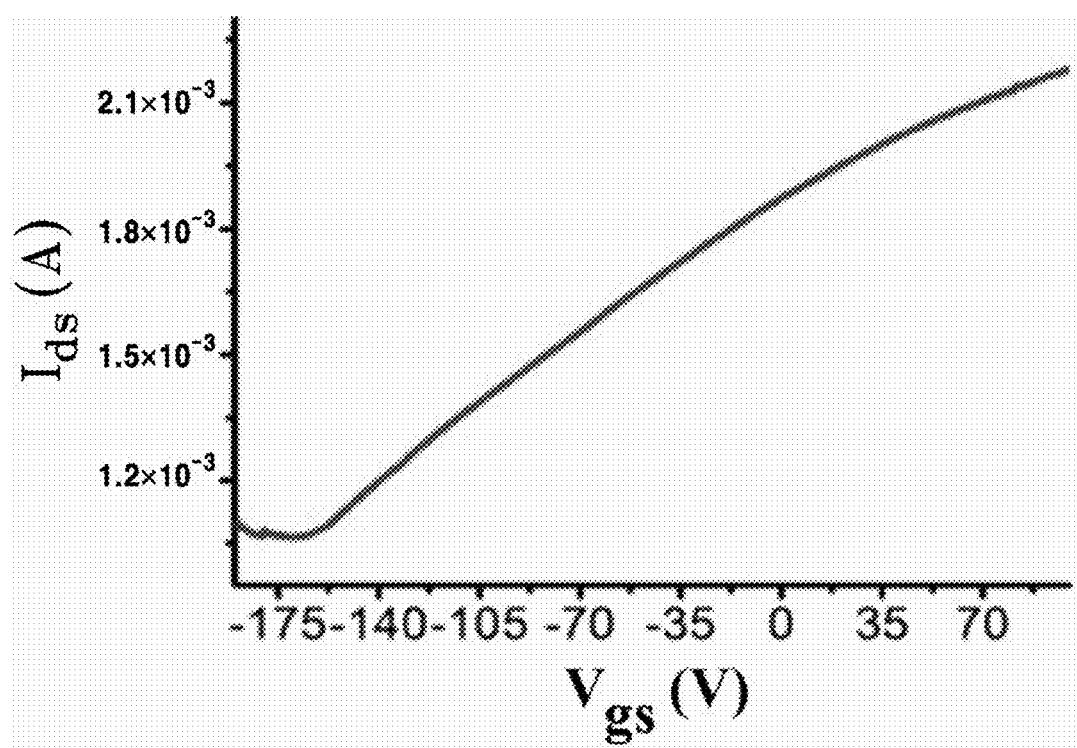
Figure 3E:
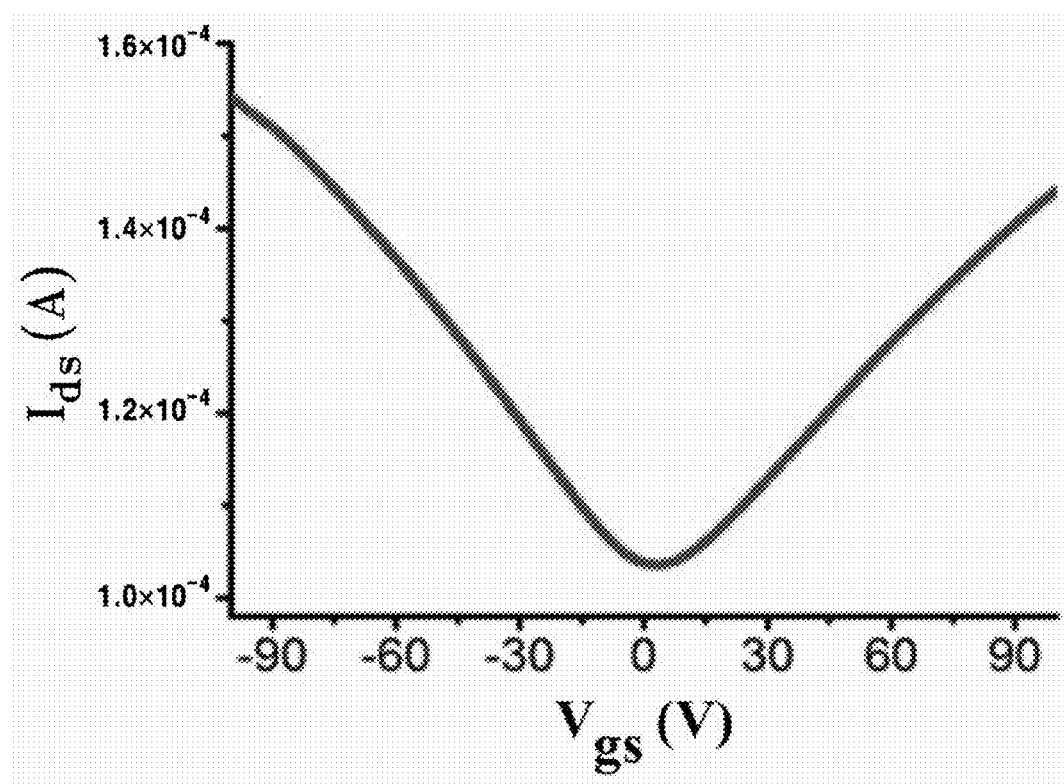
Figure 3F:
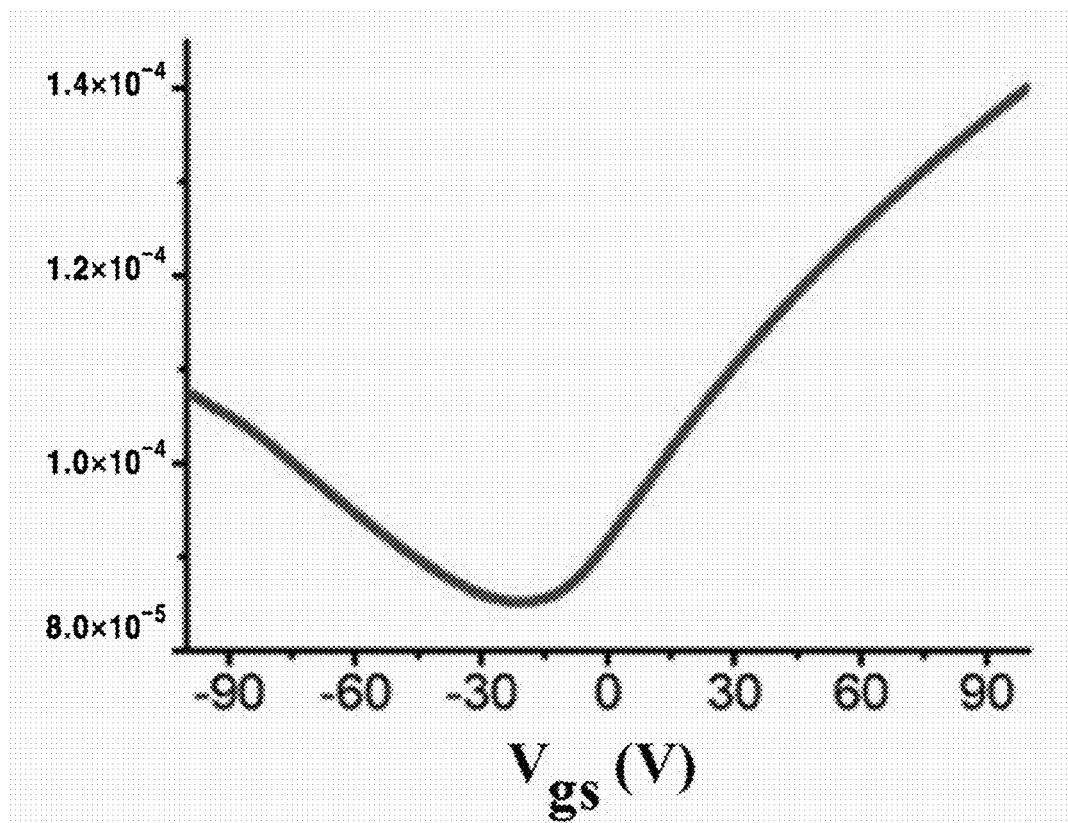
Figure 3G:
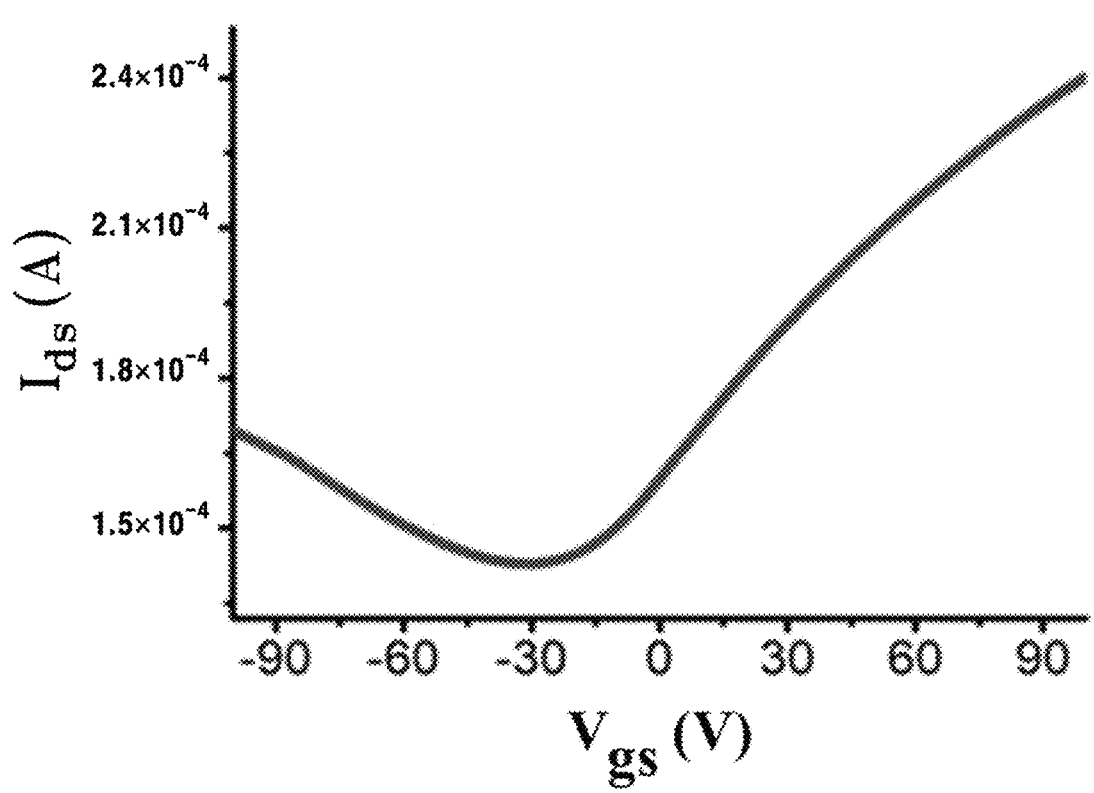
Figure 3H:
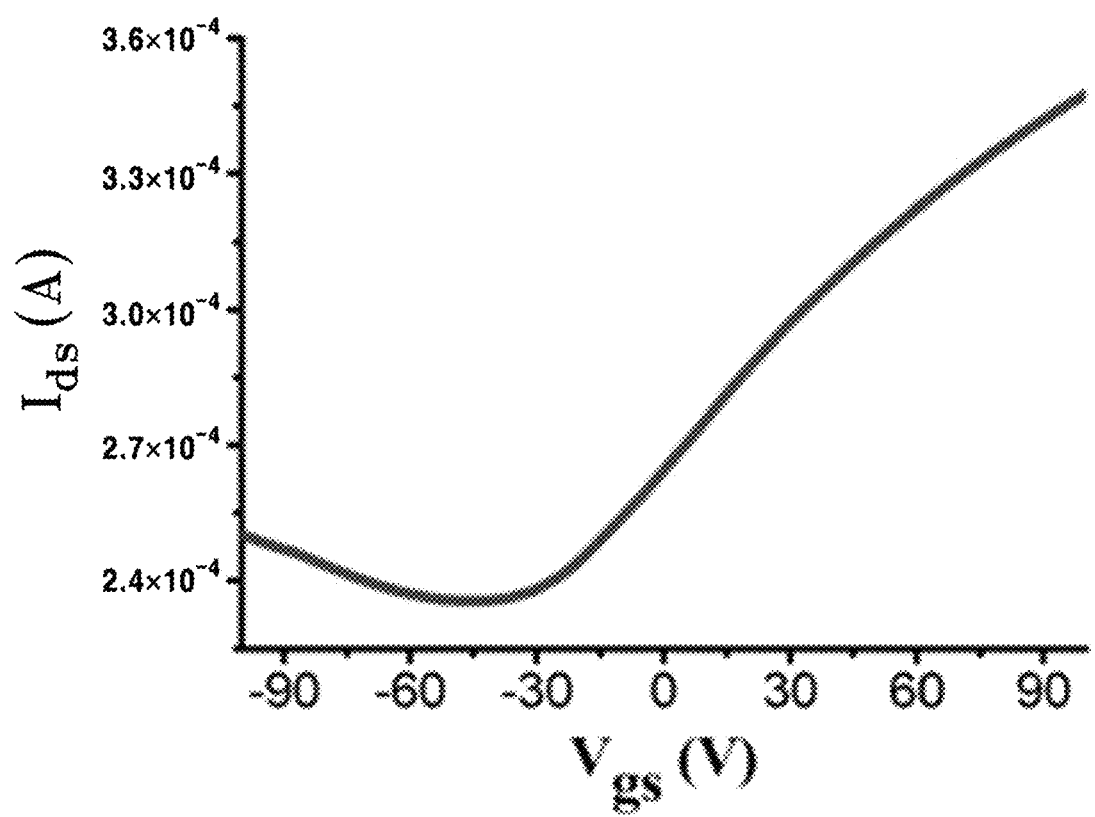

Referring to FIGS. 2F and 2G, the electrical characteristics of an example of a phosphorus-doped graphene FET formed in accordance with the present disclosure were compared with those of a nitrogen-doped graphene. Referring to FIG. 2F, in case of a monolayer graphene FET prepared without doping, a positive gate voltage ($V_{gs}$) of about 48 V was observed in vacuum, which indicated that this FET served as a P-type graphene FET. Referring to FIG. 2G, in case of a double-layer graphene FET without doping, a DP was about 80V, which showed a further enhanced P-type behavior as compared to the monolayer graphene FET.

Referring to FIG. 2E, in case of phosphorus-doping, however, a DP was reduced to about −77 V. After performing thermal annealing at about 100° C. to about 250° C., the DP was found to be a negative gate voltage in the range of about −110 V to about −170 V, and an N-type effect of about −250 V at maximum was obtained, as illustrated in FIGS. 3A to 3D. In comparison, in case of nitrogen-doping, a DP was about 25 V before thermal annealing, as illustrated in FIG. 2D. After performing thermal annealing at about 100° C. to about 250° C., the DP was found to range from about 0 V to about −45 V, as illustrated in FIGS. 3E to 3H, showing an N-type effect of about −125 V at maximum. That is, the N-type effect of phosphorus doping was found be about twice as high as the N-type effect of nitrogen-doping.

Furthermore, the stability of the phosphorus-doped graphene FET in oxygen atmosphere and the stability thereof in the air were measured. In case of a phosphorus-doped monolayer graphene FET, a DP of about −70 V was exhibited in the air, while, in vacuum, a DP was found to be almost equivalent to about −77 V, which is a DP of a phosphorus-doped double layer graphene FET. That is, it was proven that it is possible to obtain an N-type graphene field effect transistor that is stable in exposure to the air.

In accordance with another aspect of the present disclosure, there is provided a method of preparing a field effect transistor, including: forming a source electrode and a drain electrode on a substrate; and forming a channel layer including phosphorus-doped graphene, wherein the channel layer is electrically connected to the source electrode and the drain electrode.

According to one example of such a method, the phosphorus-doping may be performed by using, as a precursor, one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P$=O), phosphorane($PR_5$, $R_3P$=$CR_2$), phosphinite[$P(OR)P_2$], phosphonite[$P(OR)_2R$], phosphate[$P(OR)_3$], phosphinate[$R_2P(RO)O$], phosphonate[$RP(RO)_2O$], phosphate[$P(RO)_3O$], and their combinations. However, the precursor material is not limited thereto. By way of example, the triphenyl group-containing phosphorus compound may include triphenyl phosphine, but the precursor material is not limited thereto. By way of example, the precursor may include a phosphorus compound in a gas state, a liquid state or in a state of being dissolved in a solvent, but the precursor material is not limited thereto.

By way of example, by injecting a gas including phosphine ($PH_3$) gas or a gas such as phosphine, $PF_3$, $PCl_3$, $PBr_3$, $PI_3$, $PF_5$, $PCl_5$, $PBr_5$, $PI_5$ or the like by flowing with nitrogen gas or argon gas into a graphene prepared by chemical vapor deposition (CVD graphene), a graphene oxide or a reduced graphene oxide (rGO) in a hermetically sealed space while heating it, substitution of an oxygen-binding site of the graphene with phosphorus would be facilitated, thus allowing the phosphorus to enter the inside of the graphene. However, the method of doping is not limited thereto.

At this time, the CVD graphene, the graphene oxide or the reduced graphene oxide may be heated from a room temperature to about 1200° C. By way of non-limiting example, the CVD graphene, the graphene oxide or the reduced graphene oxide may be heated from a room temperature to, e.g., about 1200° C., about 1000° C., about 800° C., about 600° C., about 400° C. or about 200° C.

By way of another example, by injecting $P_4O_4$, $H_3PO_4$, diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P$=O), phosphorane($PR_5$, $R_3P$=$CR_2$), phosphinite[$P(OR)R_2$], phosphonite[$P(OR)_2R$], phosphate[$P(OR)_3$], phosphinate[$R_2P(RO)O$], phosphonate[$RP(RO)_2O$], or phosphate[$P(RO)_3O$] in a liquid state or in a state of being dissolved in a solvent into a graphene prepared by chemical vapor deposition in a hermetically sealed space, a graphene oxide or a reduced graphene oxide (rGO), and then heating the CVD graphene, the graphene oxide or the reduced graphene oxide, substitution of an oxygen-binding site of the graphene with phosphorus would be facilitated, thus allowing the phosphorus to incorporated into the graphene molecule. However, the method of incorporating the phosphorus into the graphene molecule is not limited thereto.

At this time, the CVD graphene, the graphene oxide or the reduced graphene oxide may be heated from a room temperature to about 1200° C. For example, the CVD graphene, the graphene oxide or the reduced graphene oxide may be heated from a room temperature of 25° C., or 20-30° C., to, e.g., about 1200° C., about 1000° C., about 800° C., about 600° C., about 400° C. or about 200° C. However, the method and the temperature used are not limited thereto.

In accordance with an illustrative example, the N-type conductivity characteristics may be rendered by performing phosphorus doping between double layers of graphene. However, the doping method and material are not limited thereto.

In accordance with an illustrative example, the weight of the phosphorus atom per the total weight of the doped graphene may range from, but may not be limited to, about 0.1 wt % to about 30 wt %. By way of example, the content of the phosphorus dopant may be in the range of, e.g., about 0.1 wt % to about 30 wt %, about 0.5 wt % to about 30 wt %, about 1 wt % to about 30 wt %, about 5 wt % to about 30 wt %, about 10 wt % to about 30 wt %, about 15 wt % to about 30 wt %, about 20 wt % to about 30 wt %, about 25 wt % to about 30 wt %, about 0.1 wt % to about 25 wt %, about 0.1 wt % to about 20 wt %, about 0.1 wt % to about 15 wt %, about 0.1 wt % to about 10 wt %, about 0.1 wt % to about 5 wt %, about 0.1 wt % to about 1 wt %, or about 0.1 wt % to about 0.5 wt %. However, the concentration is not limited thereto.

According to an example, each of the source electrode and the drain electrode may independently include one selected from the group consisting of Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and their combinations. However, the material is not limited thereto.

According to an example, the substrate may include silicon, glass or quartz, but the material is not be limited thereto.

According an example, the substrate may be a flexible or a transparent substrate, but the substrate material is not limited thereto.

In accordance with a third aspect of the present disclosure, there is provided a method of preparing a phosphorus-doped graphene, including: injecting a precursor including a phosphorus compound into graphene, wherein the phosphorus compound is in a gas phase, a liquid phase, or a state of being dissolved in a solvent; and heating the graphene for phosphorus-doping.

According to an example, the graphene may include a graphene prepared by chemical vapor deposition, a graphene oxide or a reduced graphene oxide prepared. However, the material is not limited thereto.

According to an example, the phosphorus compound may be selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P$=O), phosphorane($PR_5$, $R_3P$=$CR_2$), phosphinite[$P(OR)R_2$], phosphonite[$P(OR)_2R$], phosphate[$P(OR)_3$], phosphinate[$R_2P(RO)O$], phosphonate[$RP(RO)_2O$], phosphate[$P(RO)_3O$], and their combinations. However, the phosphorus compound is not limited thereto.

In accordance with a fourth aspect of the present disclosure, there is provided a phosphorus-doped graphene prepared by the above-described preparing method of a phosphorus-doped graphene in accordance with the third aspect of the present disclosure.

A field effect transistor formed by using a channel layer including the phosphorus-doped graphene in accordance with the present disclosure is stable in the air and exhibits an excellent N-type semiconductor characteristic. Thus, the present disclosure is expected to contribute to the development of a complementary circuit graphene logical element in which a P-type semiconductor channel transistor and an N-type semiconductor channel transistor coexist.

Hereinafter, various examples will be described in detail for illustrative purposes. However, it should be noted that the following examples are intended to facilitate understanding of the present disclosure and therefore are not intended to limit its scope.

EXAMPLES

Example 1

Material: Triphenylphosphine, triphenylamine and toluene available on the market were purchased and used. Unless otherwise mentioned, all samples were used without refined additionally Measurement: Raman spectroscopy measurement was conducted by means of a Micro-Raman System (Renishaw, RM1000-In) using excitation energy of about 2.41 eV (about 514 nm). All X-ray photoelectron spectroscopy (XPS) measurements were conducted in SIGMA PROBE (ThermoVG) using a monochromatic Al—K$\alpha$X-ray source at 100 W. All rapid thermal annealing (RTA) processes were conducted by Sam Han Vacuum development 2404. All electron transport measurements were conducted by Keithley 4200 semiconductor characterization system unit. Microstructures were observed by using a field emission scanning electron microscope (SEM) (JSM-6701F/INCA Energy, JEOL).

Preparation of graphene: As described in Document [X. Li, W. W. Cai, J. An, S. Kim, J. Nah, D. Yang, R. Piner, A. Velamakanni, I. Jung, E. Tutuc, S. K. Banerjee, L. Colombo, R. S. Ruoff, Science, 324, 1312, 2009], a graphene film was grown by chemical vapor deposition (CVD). Then, the graphene film was moved onto a substrate successfully without suffering any strong mechanical and chemical process.

Example 2

Graphene Doping Using Phosphorus Compound in Gas State

A CVD graphene prepared by chemical vapor deposition, a graphene oxide (GO) or a reduced graphene oxide (rGO) was inserted into a high-temperature furnace and pre-heated from a temperature of about 300° C. At this time, a mixture gas containing an argon gas and a phosphine ($PH_3$) gas is flown to the heated CVD graphene, oxide graphene (GO) or reduced graphene (rGO), thus doping phosphorus into the graphene. At this time, the heating temperature was increased from about 300° C. to about 1200° C. at an interval of about 100° C. The amount of the phosphorus doping was reduced with the rise of the heating temperature.

Graphene Doping Using Phosphorus Compound in a Liquid State or in a State of being Dissolved in Solvent Diphosphane ($H_2PPH_2$, Aldrich) and a CVD graphene, a graphene oxide (GO) or a reduced graphene oxide (rGO) were put into a hermetically sealed autoclave and a non-polar solvent such as toluene was injected therein. Then, the hermetically sealed autoclaves accommodating the mixtures were heated at a temperature equal or lower than about 300° C. After the heated mixtures were cooled, phosphorus-doped compounds were obtained through filtering. In order to substitute the inside of the graphene with phosphorus, the temperature was increased to about 1000° C. by using a rapid thermal annealing apparatus. Depending on the purpose of using the phosphorus-doped compounds, the thermal annealing temperature could be adjusted. With the rise of the temperature, the amount of the phosphorus-doping was found out to be reduced whereas electric conductivity and hydrophobic property increased.

Example 3

Manufacture of Phosphorus (P)-Doped Double-Layer Graphene Device

An example of a phosphorus-doped double-layer graphene device in accordance with the present disclosure as illustrated in FIG. 2C was manufactured.

First, a single layer of graphene prepared as described above was moved onto a FET device. Then, about 50 µL of solution containing a triphenyl phosphorus compound (about 10 mg/mL within anhydrous toluene) is coated on the graphene. After the device was dried in the air, another single layer of graphene is moved onto the device. Thereafter, the manufactured graphene FET device was placed in a thermal annealing apparatus and the inside of the thermal annealing apparatus was turned into a vacuum state for about 1.5 hours. Then, after flowing an argon gas containing about 10% of $H_2$ onto the graphene FET device for about 5 minutes, thermal annealing was conducted at a temperature ranging from about 100° C. to about 250° C. for about 20 seconds.

Example 4

Manufacture of Phosphorus-Doped Monolayer Graphene Channel Device

An example of a phosphorus-doped monolayer graphene channel device was manufactured by the same method as described in Example 3, except that the graphene layer was implemented by a single layer.

Comparative Example 1

Nitrogen-doped graphene channel devices were manufactured by the same methods as described in Examples 3 and 4, except that nitrogen was used as the doping material instead of phosphorus.

Comparative Example 2

A monolayer and a double-layer graphene channel devices were manufactured by the same methods as described in Examples 3 and 4, except that no doping was performed.

[Analysis of Characteristics of Graphene Channel Devices]

As a result of conducting XPS on the graphene device manufactured in Example 3, as depicted in FIG. 2A, a P2p peak at about 130.5 eV, corresponded to P—C bond based on a reference material related to a phosphorus-containing carbon material. Thus, it was proven that the phosphorus-doped double-layer graphene device includes such a P—C coupling. Meanwhile, as a result of conducting XPS by using the nitrogen-doped double-layer graphene in the comparative example, an N1s peak was observed at about 500.1 eV, which corresponded to C—N bond (FIG. 2B).

The degrees of doping of the nitrogen and the phosphorus obtained by XPS were found to be about 5.05% and about 4.96%, respectively, as shown in Table 1. In order to investigate the degree of doping, energy dispersion X-ray spectroscopy (EDX) was conducted, and values of about 5.14% and about 5.01% were acquired for the nitrogen and the phosphorus, respectively, which confirmed the XPS result.

TABLE 1

Amounts of phosphorus and nitrogen (atom %) within double-layer graphene after conducting thermal annealing at about 250° C.

| XPS/P, N | EDX/P, N |
|---|---|
| 4.96, 5.05 | 5.01, 5.14 |

Further, in order to investigate a surface morphology and a thickness of the graphene layer, the manufactured devices were observed with a scanning electron microscope (SEM) and the result was shown in FIGS. 8A to 10B.

Figure 8A:
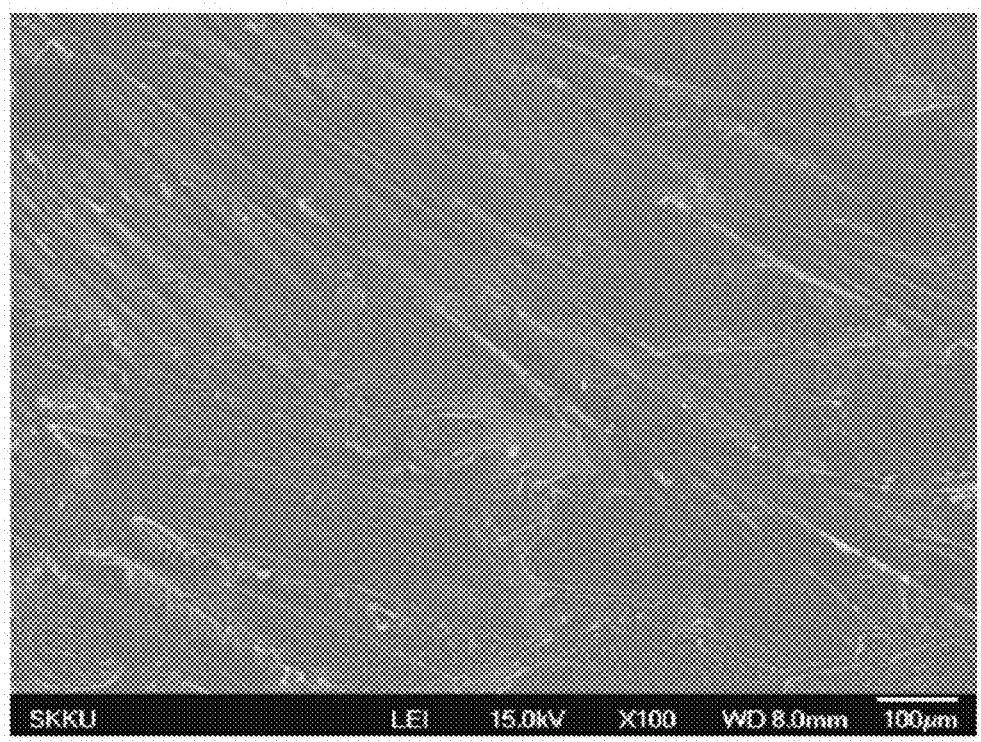
FIGS. 8A to 8C are scanning electron microscope (SEM) images of field effect transistors in accordance with an example of the present disclosure.
Figure 8B:
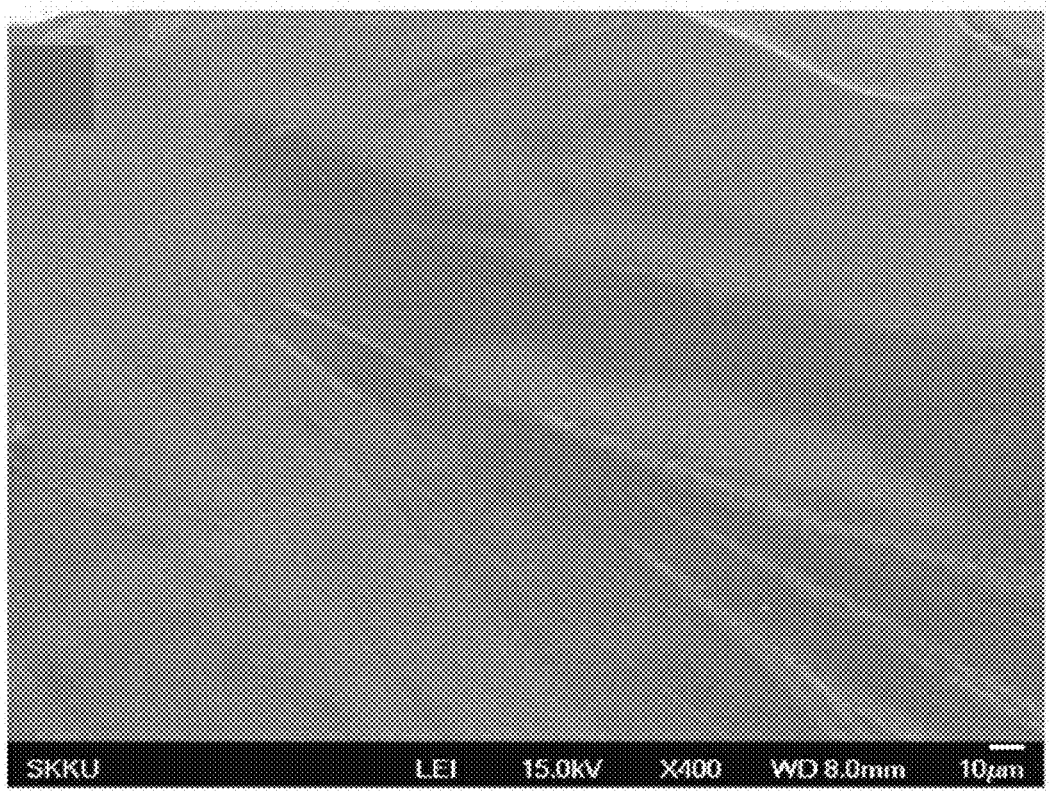
Figure 8C:
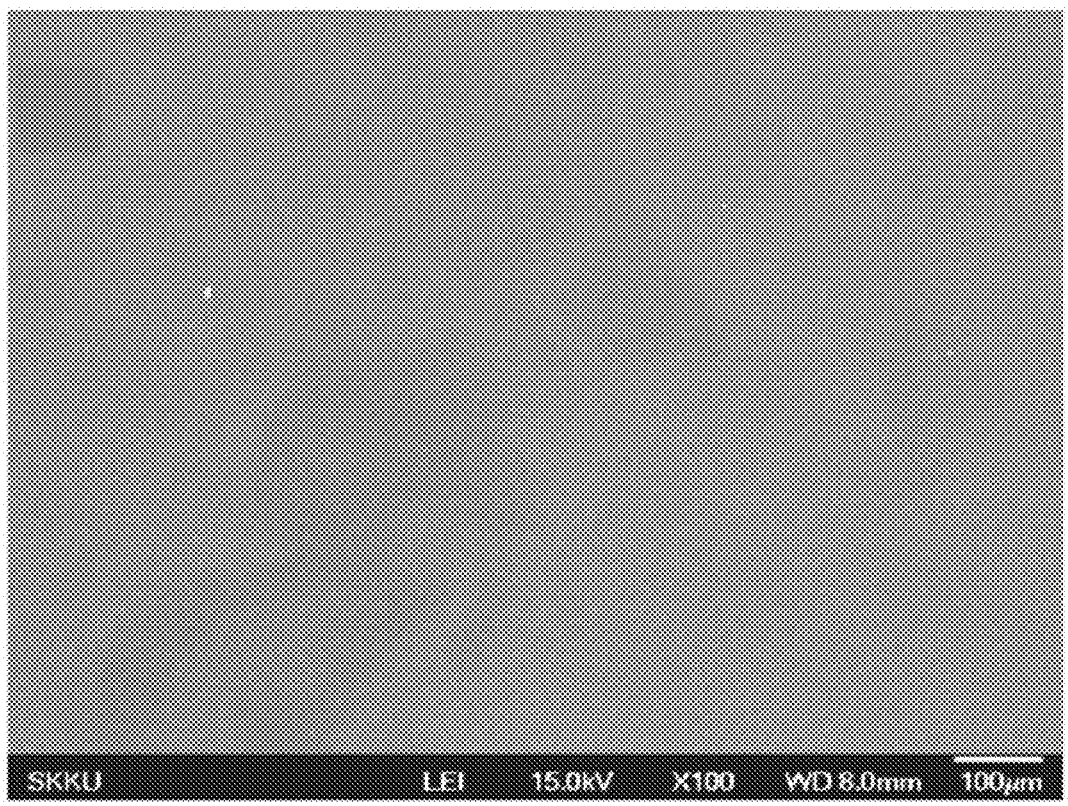

FIG. 8A is a SEM image of one example of a phosphorus-doped monolayer field effect transistor; FIG. 8B, a SEM image of an example of a phosphorus-doped double-layer field effect transistor; and FIG. 8C, a SEM image of an example of a phosphorus-doped double-layer field effect transistor after thermal annealing was conducted at about 250° C.

Figure 9A:
FIGS. 9A to 9C are SEM images of field effect transistors in accordance with a comparative example of the present disclosure.
Figure 9B:
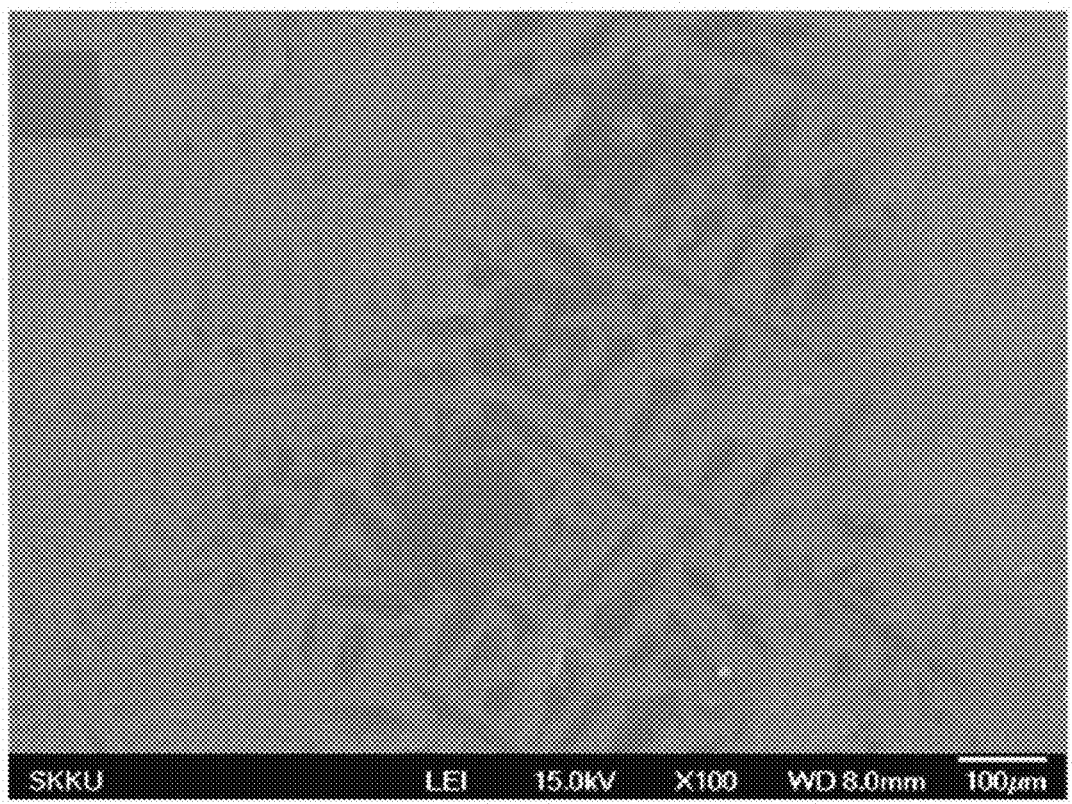
Figure 9C:
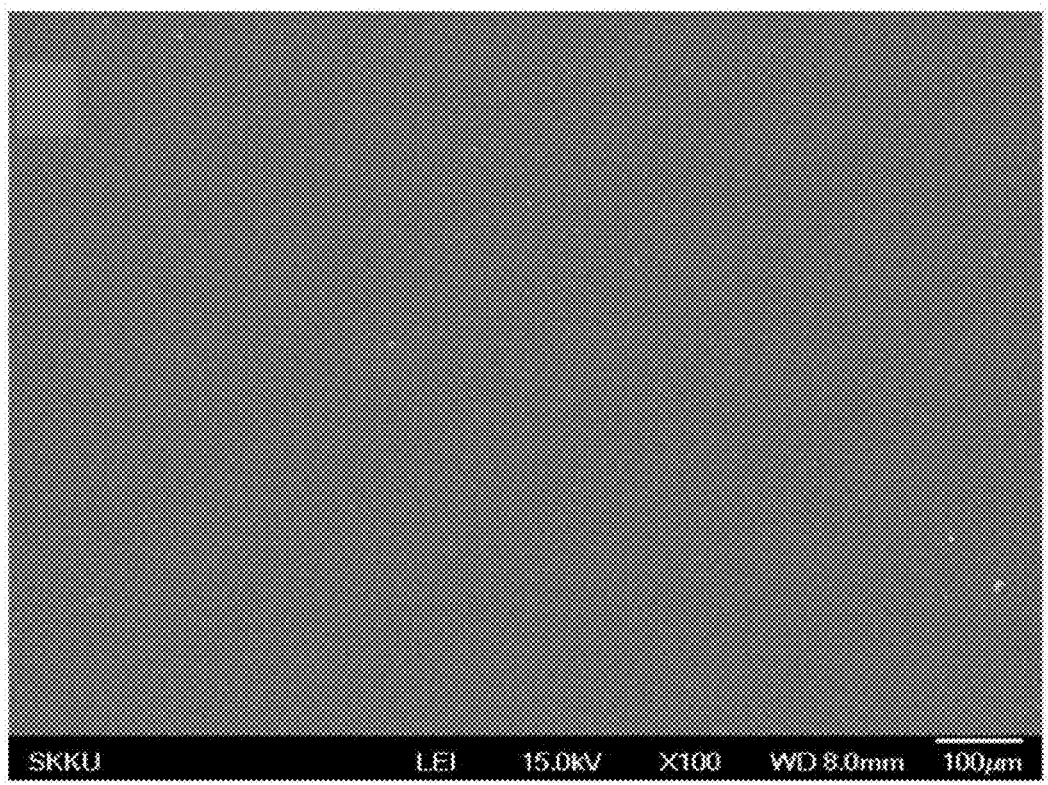

FIG. 9A is a SEM image of a nitrogen-doped monolayer field effect transistor; FIG. 9B, a SEM image of a nitrogen-doped double-layer field effect transistor; and FIG. 9C, a SEM image of a nitrogen-doped double-layer field effect transistor after thermal annealing was conducted at about 250° C.

Figure 10A:
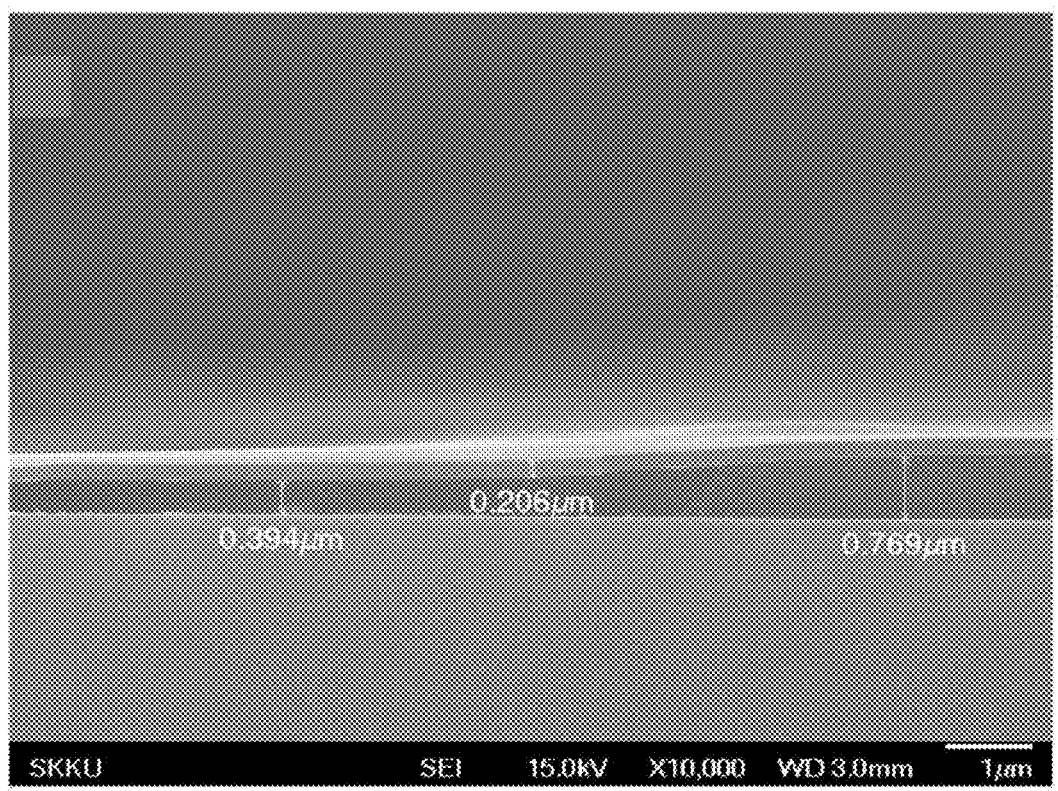
FIGS. 10A to 10B are SEM images of field effect transistors in accordance with a comparative example of the present disclosure.
Figure 10B:
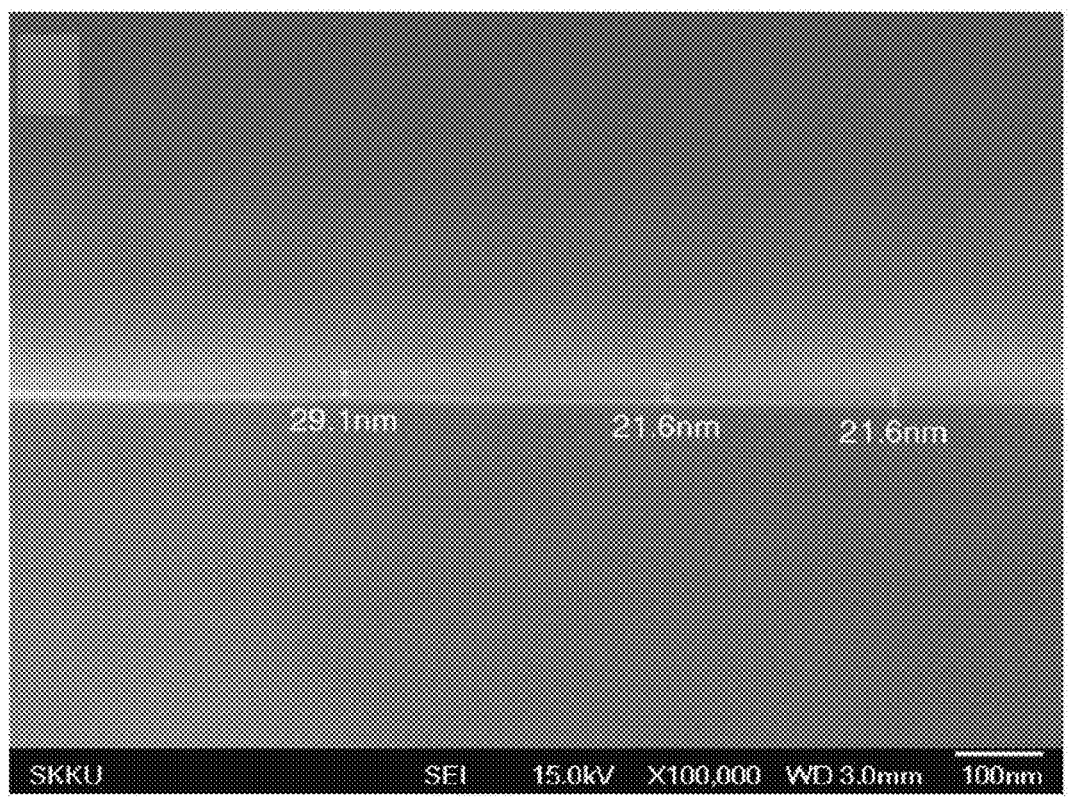

FIG. 10A is a transversal cross sectional view of an example of a phosphorus-doped double-layer field effect transistor before thermal annealing is conducted. FIG. 10B is a transversal cross sectional view of the phosphorus-doped double-layer field effect transistor after the thermal annealing was conducted at about 250° C.

As depicted in FIGS. 8A to 10B, when the doping materials were doped in the graphene monolayers, the surfaces of the graphene monolayers were found to be slightly rough. In contrast, after doping the doping materials between the double layers of graphene and performing the thermal annealing process, the doping materials were found to be well dispersed, producing smooth surfaces.

The thicknesses the doped materials ranged about 0.4 μm to about 0.8 μm. After the thermal annealing process at about 250° C., the thicknesses were reduced to about 21 nm to about 29 nm.

[Measurement of Electrical Characteristics of Graphene Channel Devices Depending on Doping Material]

As well known, an N-type semiconductor behavior may be obtained not only by substituting carbon atoms with atoms of doping materials within a graphene frame but also by donating the ability of their lone pairs to a system network.

In order to investigate an effect of phosphorus doping for improving electrical characteristics of a phosphorus-doped graphene channel device in accordance with the present disclosure, the electrical characteristics of Example 3, Comparative Example 1 (nitrogen-doped graphene channel device) and Comparative Example 2 (graphene channel device without containing a doping material) were measured. Specifically, their transfer characteristic curves obtained in vacuum, Dirac voltages and variations in drain currents were measured, and the measurement results are provided in FIGS. 2D to 2G.

To elaborate, in order to investigate the typical electrical characteristics of the double-layer graphene FETs, phosphorus or nitrogen was coated between double-layer of graphene, and the double-layer graphene FETs coated with the phosphorus and nitrogen, respectively, were annealed at different temperatures, ranging from, about 100° C. to about 250° C. Then, the electrical characteristics of the thus manufactured devices were measured. The monolayer graphene device exhibited a P-type behavior in the air because of the presence of PMMA, moisture, oxygen or impurities introduced during the device manufacturing processes on the monolayer graphenes. In order to avoid problems that might be caused by physically adsorbed oxygen, the devices were measured in vacuum. Gate voltages in the range of about −200 V to about 100 V were investigated at a drain-source bias maintained constant at about 0.5 V.

FIG. 2D is a graph showing an electrical characteristic of the nitrogen-doped graphene channel device of Comparative Example 1. FIG. 2E is a graph showing an electrical characteristic of an example of a phosphorus-doped graphene channel device in accordance with the present disclosure. FIGS. 2F and 2g are graphs showing electrical characteristics of graphene monolayer and double layers when no doping material is added, respectively.

Referring to FIG. 2F, in case of the manufactured monolayer graphene FET, a positive gate voltage ($V_{gs}$) of about 48 V was observed in vacuum, which indicated that the device served as a P-type graphene FET. Referring to FIG. 2G, in case of the double-layer graphene FET, a DP was found at about 80 V, showing a more enhanced P-type behavior than that of the monolayer graphene FET. Further, existence of PMMA on the second graphene layer of the double-layer graphene FET caused this device in the comparative group to show a more enhanced P-type behavior as compared to the case of monolayer.

Referring to FIG. 2E, a DP of the manufactured phosphorus-doped graphene FET before conducting thermal annealing was about −77 V. Referring to FIG. 2D, a DP of the manufactured nitrogen-doped graphene FET before conducting thermal annealing was about 25 V. In both of these FETs, an N-type behavior having a DP moved to the left from a DP of the double-layer graphene FET (a DP of about 80 V shown in FIG. 2G) in the comparative group.

An uncontaminated graphene and PMMA on the graphene may cause a P-type effect of moving a DP to a positive gate voltage, whereas phosphorus and nitrogen cause an N-type effect of moving a DP to a negative gate voltage. As can be seen from FIGS. 2D, 2E and 2G, a high P-type effect competes with a high N-type effect in both cases before thermal annealing is conducted. Accordingly, it may be difficult to find the largest negative DP shift. The effect of doped molecules can be observed more apparently after thermal annealing is conducted at different temperature. DPs of the phosphorus-doped devices manufactured by performing thermal annealing at a temperature range from about 100° C. to about 250° C. were found to be negative gate voltages in the range from about −110 V to about −170 V in vacuum, which indicated an N-type electron doping behavior due to phosphorus dopants between the double layers of graphene, as illustrated in FIGS. 3A to 3D. The DPs of the phosphorus-doped double-layer graphene FETs were found to increase gradually from about −77 V to about −170 V as they were annealed at temperatures increased from about 100° C. to about 250° C.

DPs of the nitrogen-doped devices manufactured by performing thermal annealing at a temperature range from about 100r to about 250° C. were found to be negative gate voltages in the range from about 0 V to about −45 V, which indicated an N-type electron doping behavior due to nitrogen dopants between the double layers of graphene, as illustrated in FIGS. 3E to 3H. The DPs of the nitrogen-doped double-layer graphene FETs were found to increase gradually from about 25 V to about −45 V as they were annealed at temperatures increased from about 100° C. to about 250° C.

With the rise of the thermal annealing temperature, DPs of both the phosphorus-doped and nitrogen-doped graphene FETs were moved from a weak N-type characteristic to a strong N-type characteristic. In both cases, the largest DP shifts were observed after the thermal annealing conducted at about 250° C.

Further, it was also found out that a higher thermal annealing temperature would decrease steric-crowding of molecules between the graphene layers, thus increasing contact with the phosphorus or the nitrogen, and allowing graphene sandwiches to be perfectly doped with phosphorus or nitrogen.

Further, a transfer characteristic curve and mobility of electrons and holes of an example of a phosphorus-doped graphene channel device in accordance with the present disclosure and a nitrogen-doped graphene channel device were measured. Field effect mobility was calculated from a drain-source current ($I_{ds}$)/back-gate potential ($V_g$) curve by using the following equation and provided in the following Table 2.

$$\mu = [\Delta I_{ds}/V_{ds}](L/W)]C_{OX}\Delta V_g$$

Here, L and W represent a length and a width of a graphene channel, respectively, and $C_{ox}$ is calculated by $\in 0 \in_r A/d$, wherein d denotes a thickness of $SiO_2$; A denotes a unit area thereof; and $\in 0 \in_r$ denotes a dielectric constant of a free space.

TABLE 2

| Device | Electron mobility | Hole mobility |
|---|---|---|
| Example 3 (Phosphorus-doped graphene FET) | ~556 cm$^2$V$^{-1}$S$^{-1}$ | ~112 cm$^2$V$^{-1}$S$^{-1}$ |
| Comparative Example 1 (Nitrogen-doped graphene FET) | ~235 cm$^2$V$^{-1}$S$^{-1}$ | ~127 cm$^2$V$^{-1}$S$^{-1}$ |
| Comparative Example 2 (Non-doped graphene FET) | ~110 cm$^2$V$^{-1}$S$^{-1}$ | ~159 cm$^2$V$^{-1}$S$^{-1}$ |

As shown in Table 2, after the thermal annealing was conducted, the phosphorus-doped graphene channel device exhibited electron mobility of about 556 cm$^2$V$^{-1}$ S$^{-1}$ at maximum, which was about five times as high as the electron mobility of the non-doped graphene device and about twice as high as the electron mobility of the nitrogen-doped graphene device due to high electron donation ability of the phosphorus. That is, the phosphorus-doped graphene channel device showed higher level of N-type behavior.

[Raman Analysis Depending on Doping Material]

Raman spectroscopy is the most direct and nondestructive technique for characterizing the structure and the property of carbon material, especially for determining a defect, an ordered structure and a disordered structure of a graphene.

Raman spectra were measured at an excitation wavelength of about 514 nm under ambient condition. Raman spectra of Example 3 (phosphorus-doped graphene channel device), Comparative Example 1 (nitrogen-doped graphene channel device) and Comparative Example 2 (graphene channel device without containing doping material) were measured. The measurement results are provided in FIGS. 4A and 4B and FIGS. 5A to 5D.

Figure 4A:
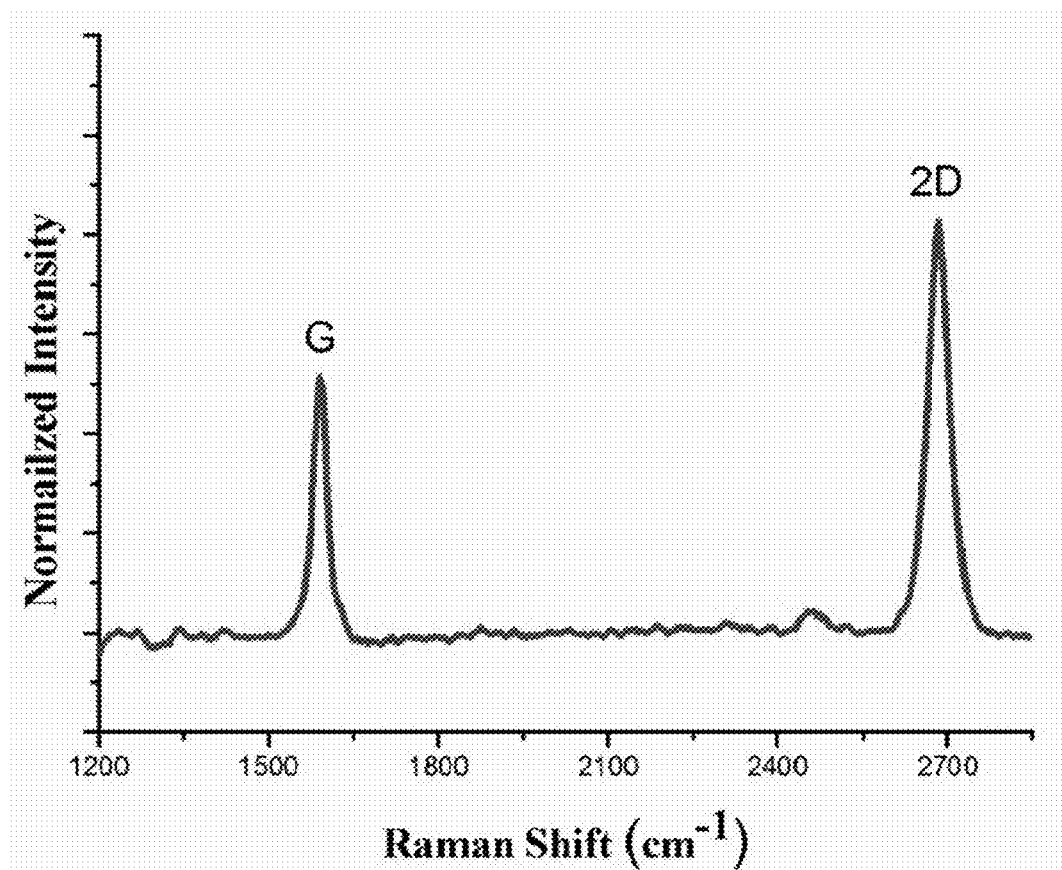
FIGS. 4A and 4B illustrate Raman spectra of field effect transistors in accordance with an example of the present disclosure.
Figure 4B:
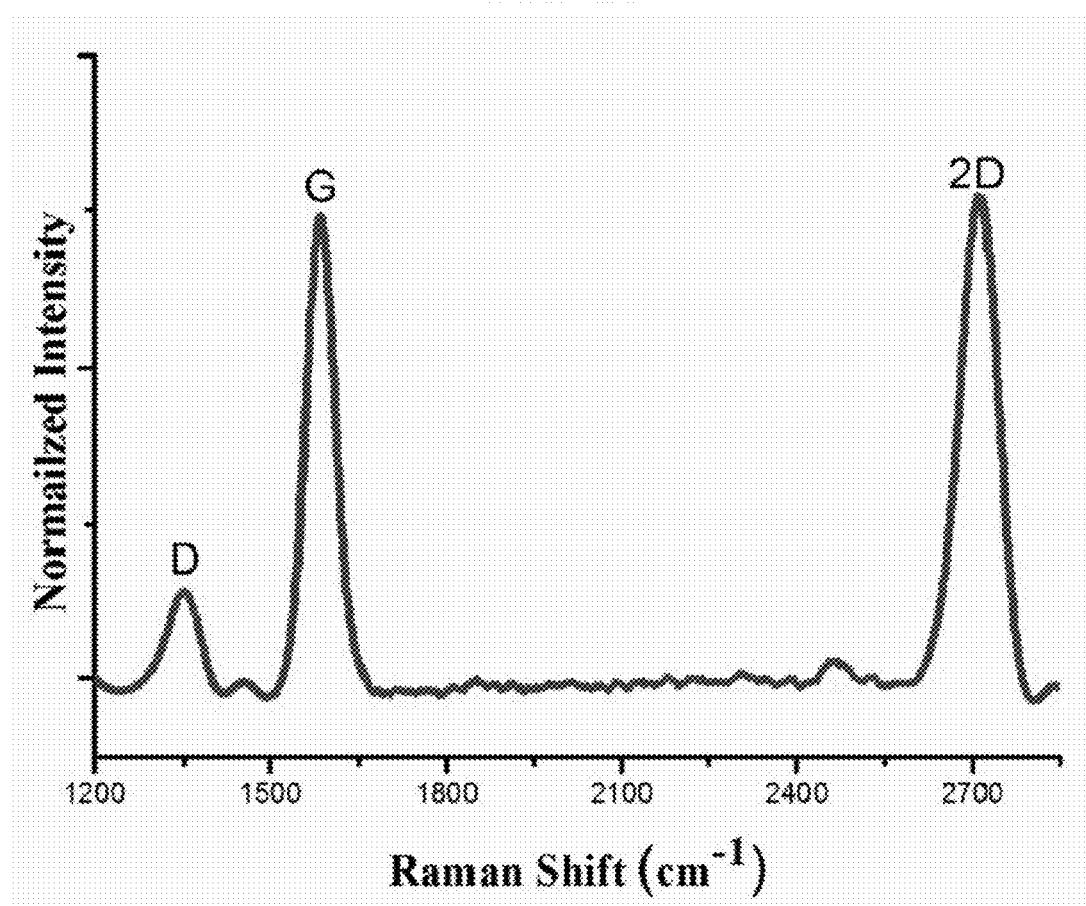
Figure 5A:
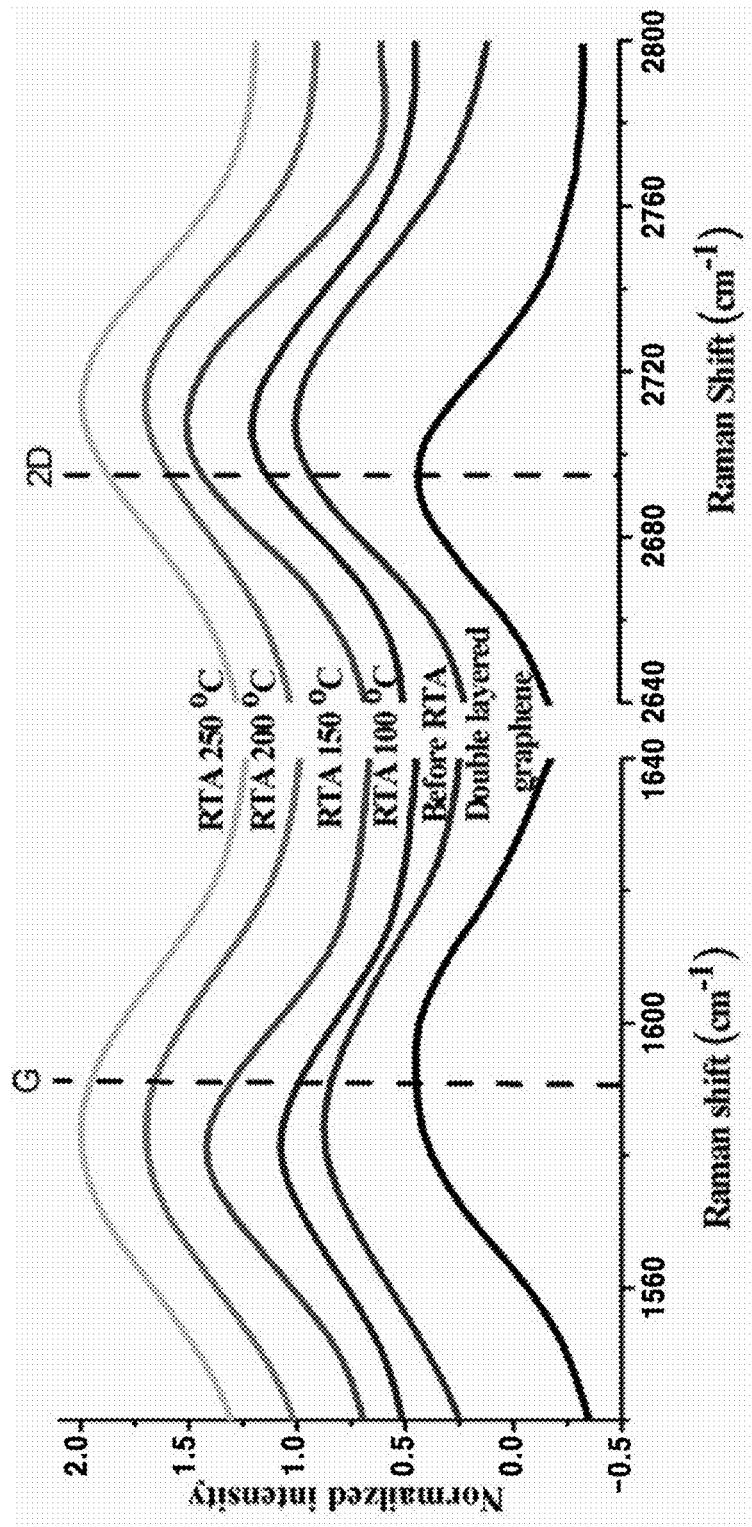
FIGS. 5A to 5D illustrate Raman spectra of field effect transistors in accordance with an example of the present disclosure.

As shown in the FIG. 4A and in FIG. 5A, two clear peaks (a G band at about 1,590 cm$^{-1}$ and a 2D band at about 2,684 cm$^{-1}$) were observed on the Raman spectrum of the double-layer graphene film. A D band (about 1,351 cm$^{-1}$) appeared after molecules were introduced between the graphene layers and it is deemed to be these molecules increased disorder of the graphene basic frame (FIG. 4B). FIG. 5A shows different results for the G band and the 2D band frequencies of the phosphorus-doped double-layer graphene film before and after thermal annealing was conducted. The Raman spectrum showed typical shifts of G (left side) and 2D (right side) of the double-layer graphene film depending on presence or absence of doping molecules. As the thermal annealing temperature increased, G (left side) and 2D (right side) bands were moved further from the case before the thermal annealing was performed. The G peak of generated material was found to be gradually moved to about 1,580 cm$^{-1}$ as compared to the double-layer graphene film (about 1,590 cm$^{-1}$). The 2D frequency was found to be moved upfield as the phosphorus molecules or the nitrogen molecules were doped. Further, as the thermal annealing temperature increased, the 2D peak was found be gradually moved to about 2,714 cm$^{-1}$ as compared to the case of the double-layer graphene film (2,684 cm$^{-1}$)).

Figure 5B:
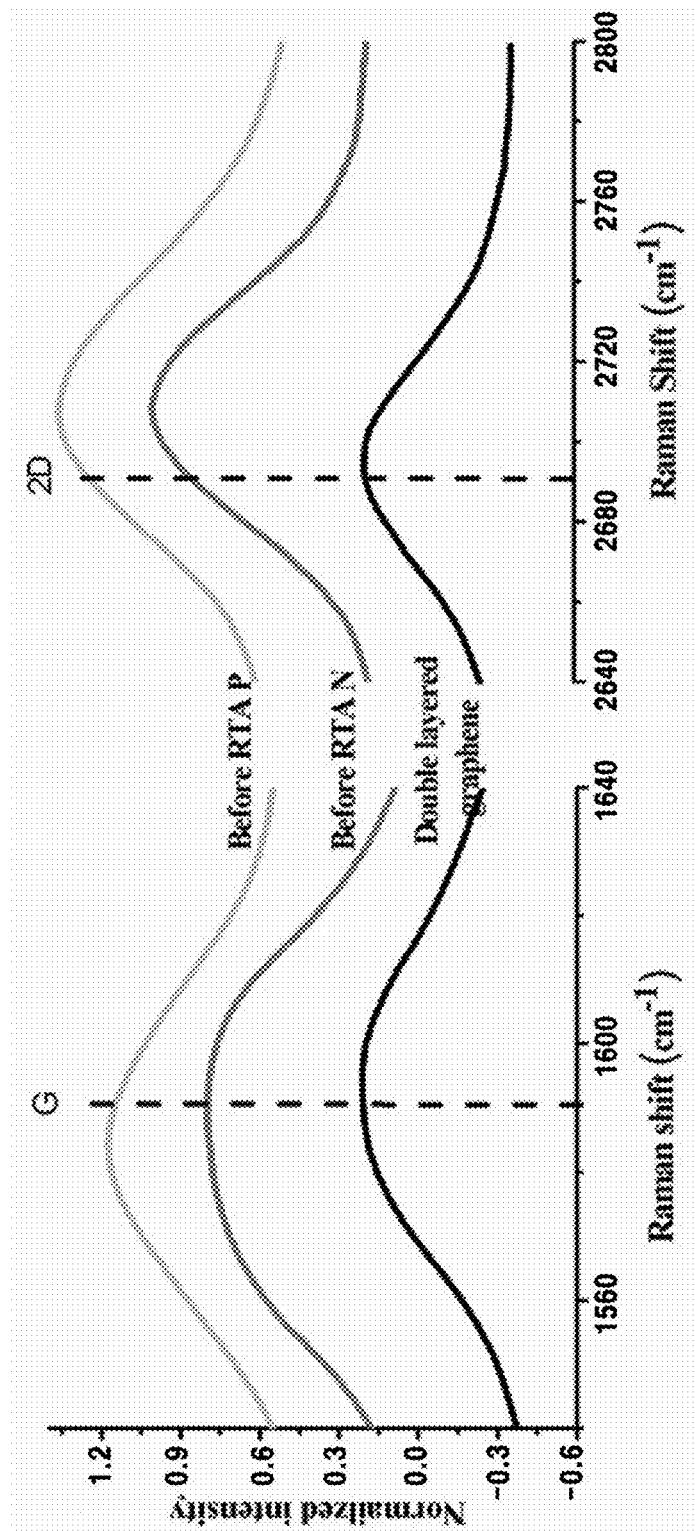

To the contrary, a Raman G-band frequency of the double layer graphene film was moved downfield, having an N-type effect of molecule doping of the present disclosure. Further, a G band of the phosphorus-doped graphene before thermal annealing (about 1,586 cm$^{-1}$) was found to be moved more downfield than the case of the nitrogen-doped graphene before thermal annealing (about 1,589 cm$^{-1}$) (FIG. 5B). This is deemed to be because the molecule doping causes a defect within the graphene film and the defect disperses electrons effectively in a non-insulation state. The downfield shift of the G band caused by the N-type doping was also observed in the monolayer graphene film, contributing to electrical effect.

Further, a strength ratio of $I_{2D}/I_G$ was observed to be greatly reduced after the molecule doping, which indicates that molecule doping occurred between the graphene layers. These phosphorus and nitrogen molecules that have one of electron donation lone pairs caused a decrease of the $I_{2D}/I_G$ ratio due to the doping effect of these molecules. Accordingly, the occurrence of the molecule doping between the double layers of graphene films was proven by the downfield shift of the dynamic D and the upfield shift of the 2D band. Based on these results, it may be conjectured that as the thermal annealing temperature increases, phosphorus atoms are capable of generating N-type doping behavior more than nitrogen atoms.

Figure 5C:
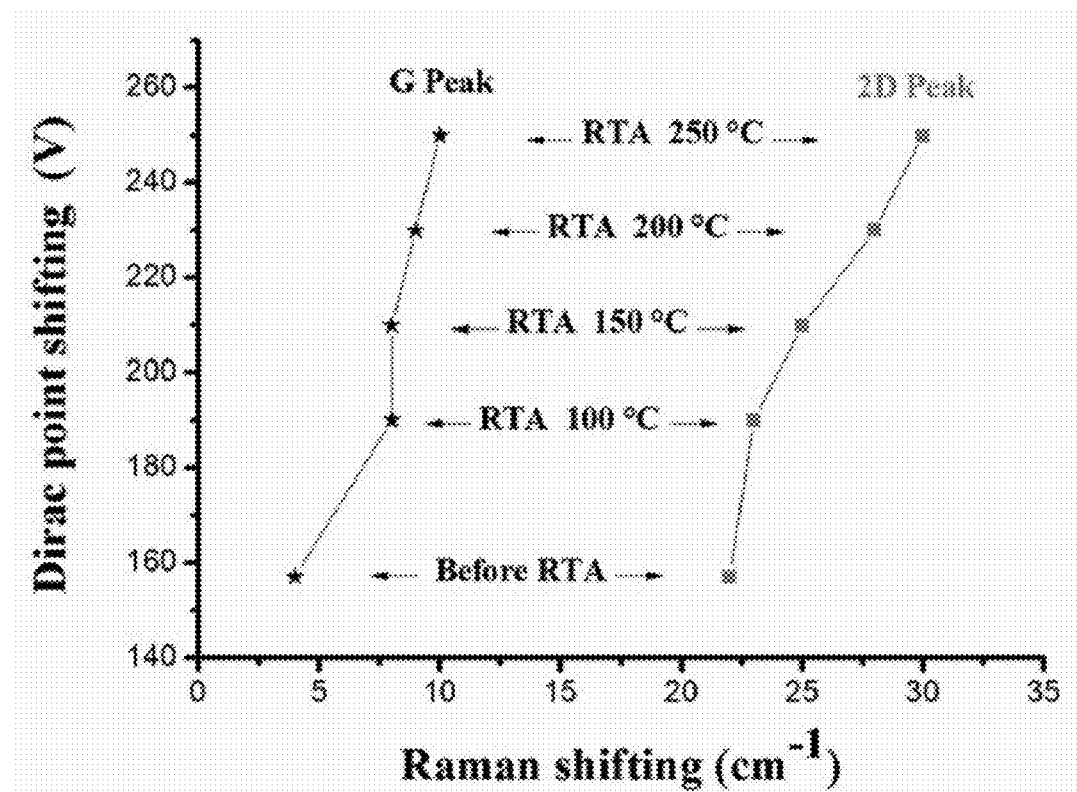
Figure 5D:
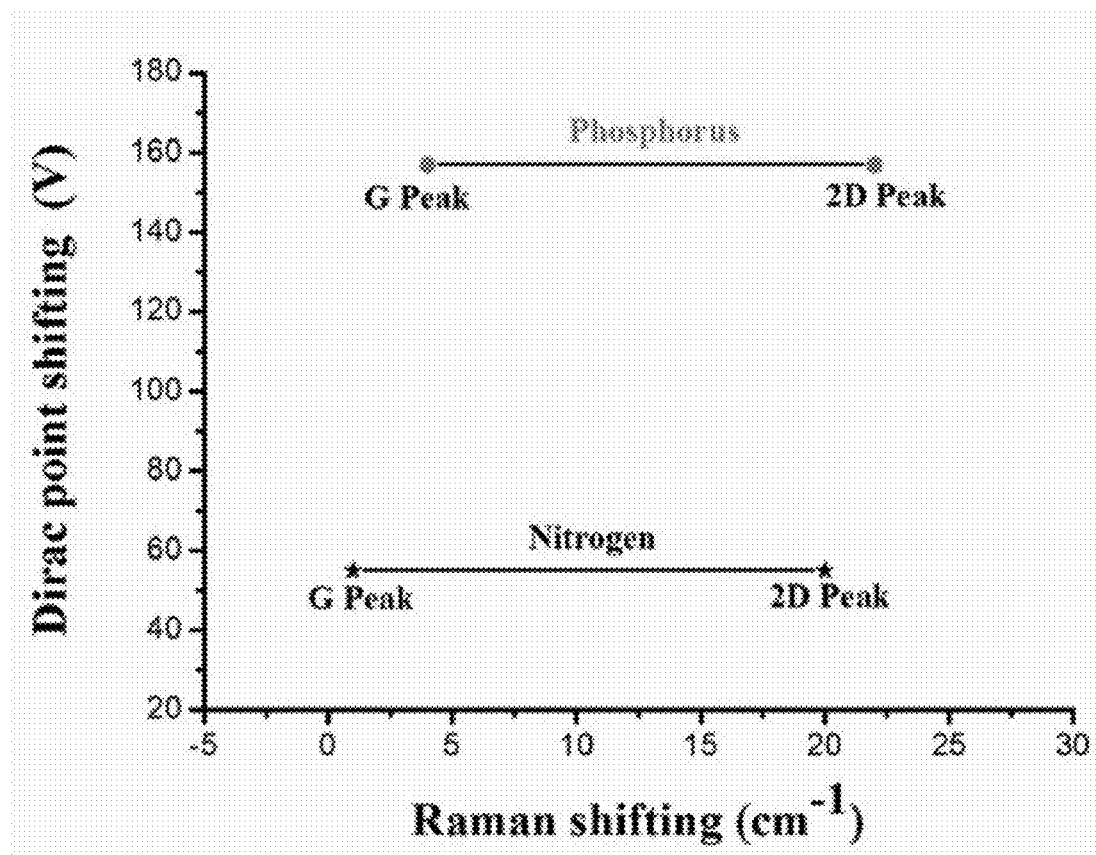

Besides, a relationship between the Raman shift (shift of G and 2D peaks within the Raman spectrum as compared to the double layer graphene film without doped) and the DP shift of the phosphorus-doped double-layer graphene FET (PDG-FET) (FIG. 5C) and a relationship between the Raman shift and the DP shift of the nitrogen-doped double-layer graphene FET (NDGFET) (FIG. 5D) were observed. As a result, the Raman spectra of the G and 2D peaks showed downfield shift up to approximately 4 to 10 cm$^{-1}$, and upfield up to approximately 22 to 30 cm$^{-1}$, respectively, with respect to double-layer graphene before and after thermal annealing, while the DP shifts of phosphorus-doped double-layer graphene FET were about 157 to 250 V, respectively, with respect to double layered graphene (FIG. 5C). Raman shifts of the G peaks were downfield by about 4 cm$^{-1}$ for phosphorus and 1 cm$^{-1}$ for nitrogen. The Raman shifts of the 2D peaks were upfield by about 22 cm$^{-1}$ for phosphorus and about 20 cm$^{-1}$ for nitrogen with respect to only double-layer graphene before thermal annealing. DP shifts were about 157 V for phosphorus and 55 V for nitrogen with respect to only double-layer graphene (FIG. 5D). Thus, phosphorus doping on the graphene channel turned out to be a remarkably strong n-type FET.

[Measurement of Stability of Graphene Channel Device]

Stability of graphene FET in an atmosphere that contains oxygen and in the humid air is an important factor that determines the practical application fields of such a FET. In general, a graphene semiconductor channel shows P-type conductivity characteristics in the atmosphere with oxygen or in the air by being doped with oxygen. Even a channel that is doped to exhibit N-type conductivity is easily converted to a P-type channel by being doped with oxygen in exposure to the atmosphere. Accordingly, it is desirable to develop a semiconductor channel capable of maintaining its N-type conductivity characteristics even after a prolonged exposure to the atmosphere.

To this end, in order to investigate the stability of a phosphorus-doped graphene channel produced in accordance with the present disclosure, the following experiment was conducted.

Figure 6A:
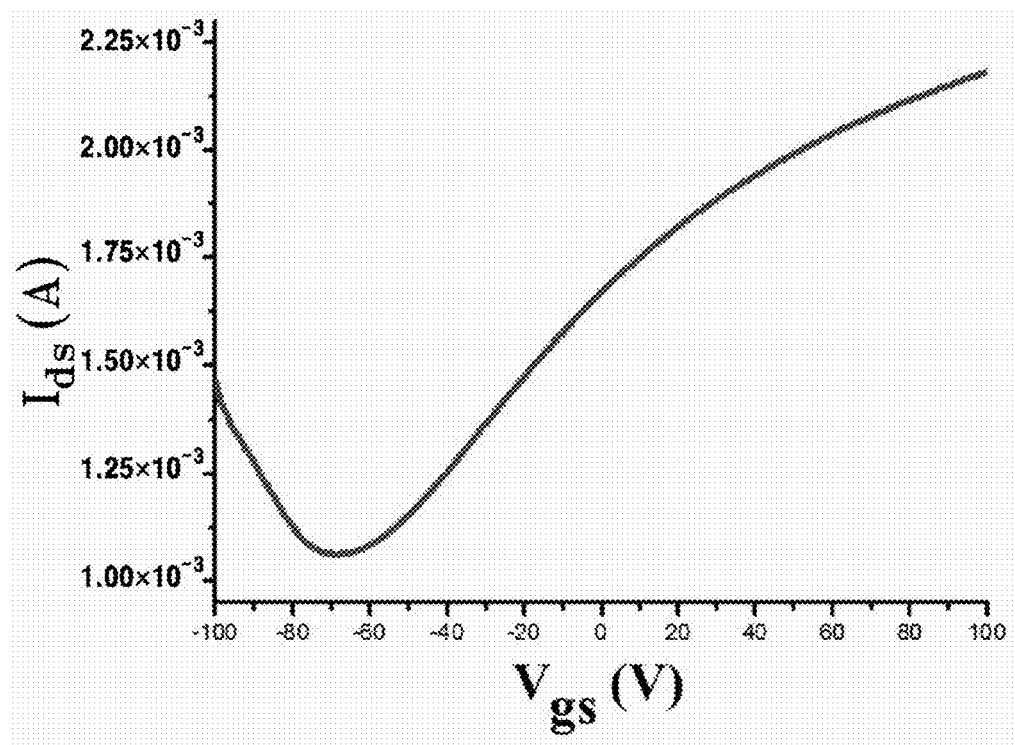
FIGS. 6A and 6B illustrate graphs showing stability of field effect transistors in accordance with an example of the present disclosure.
Figure 6B:
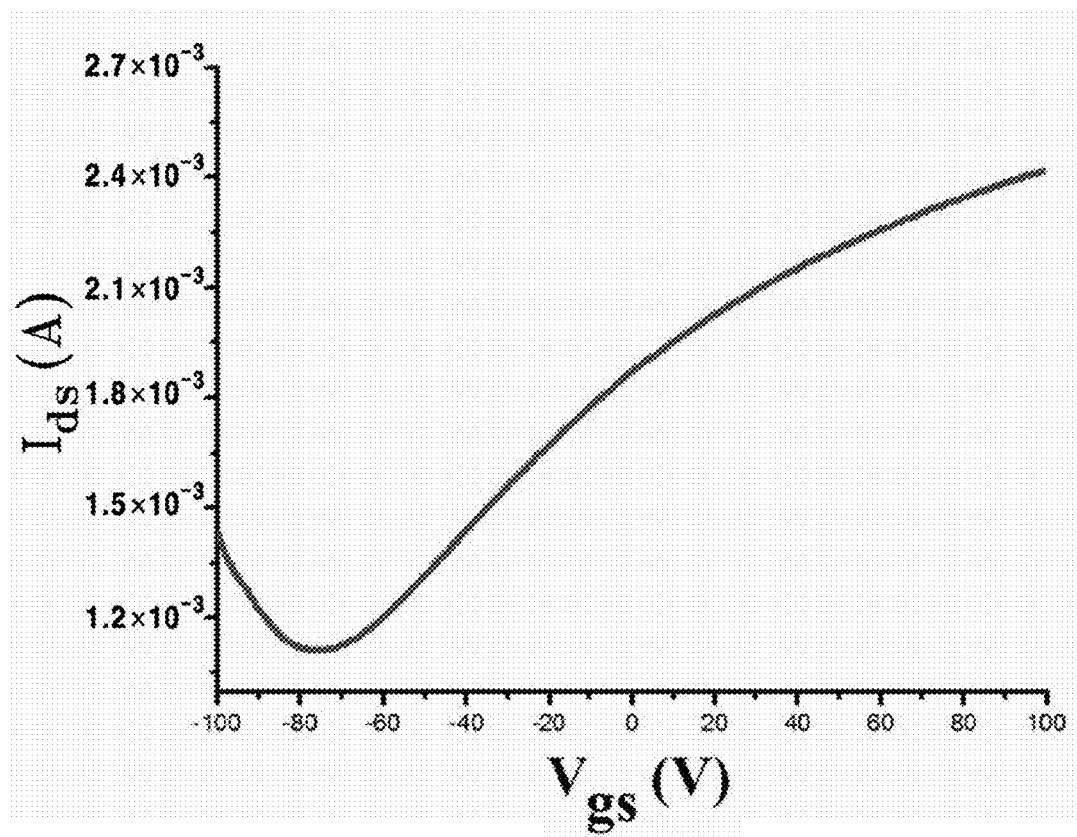

Electrical characteristics of the graphene FET were measured in the air, and the measurement result is provided in FIGS. 6A and 6B.

As depicted in FIG. 6A, a DP of a nitrogen-coated monolayer FET was about 22 V in the air, which is similar to the DP (about 25 V in vacuum) of the double-layer nitrogen-doped FET as mentioned above. As shown in FIG. 6B, a DP of a phosphorus-doped monolayer graphene FET was about −70 V in the air, which is similar to the DP of the double-layer phosphorus-doped FET as mentioned above (about −77 V in vacuum). That is, a very strong N-type behavior was observed even in the presence of a high P-doping effect of oxygen and moisture from open atmosphere.

This experiment result implies that phosphorus has much stronger electron donation ability to graphene than nitrogen and thus it exhibits an N-type characteristic that is strong even in the presence of a high P-doping effect of oxygen and moisture, i.e., stable in the air.

Further, after the phosphorus-doped graphene channel device of Example 3 was left in the air for about 30 days, its electric characteristics in the air were measured through the use of a DP and a drain current variation. The measurement result is provided in FIGS. 7A and 7B along with a transfer characteristic curve obtained in vacuum.

Figure 7A:
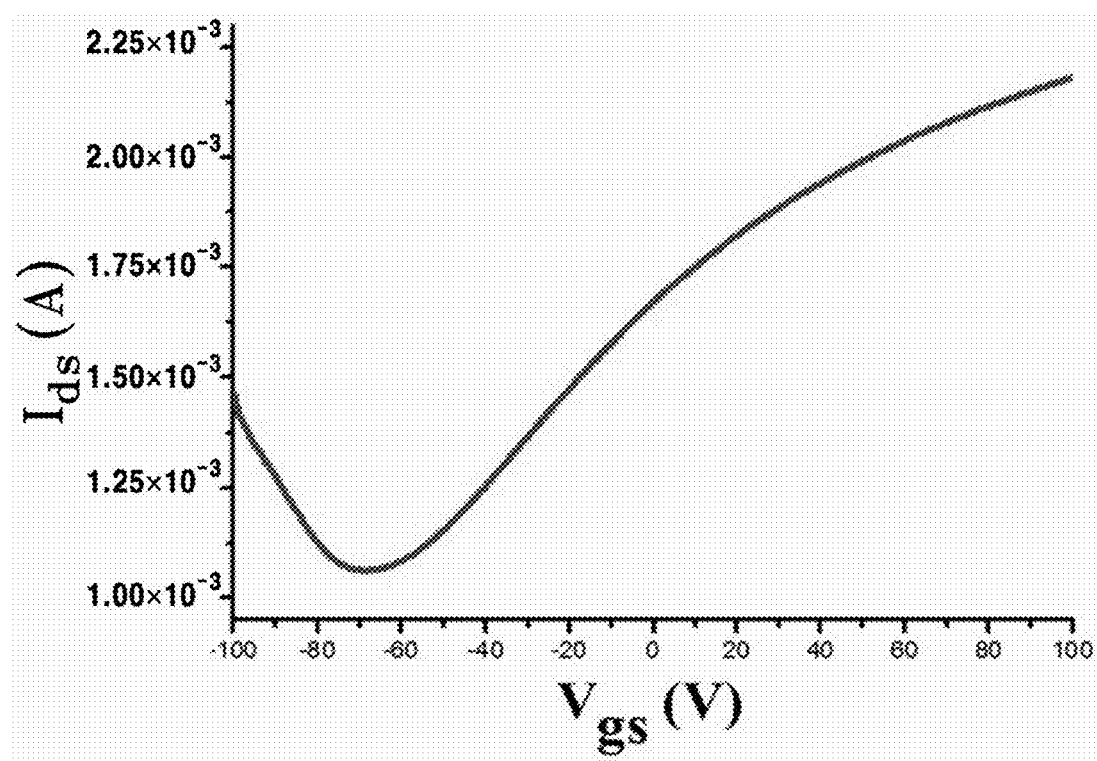
FIGS. 7A and 7B are graphs showing the stability of a field effect transistor in accordance with an example of the present disclosure.
Figure 7B:
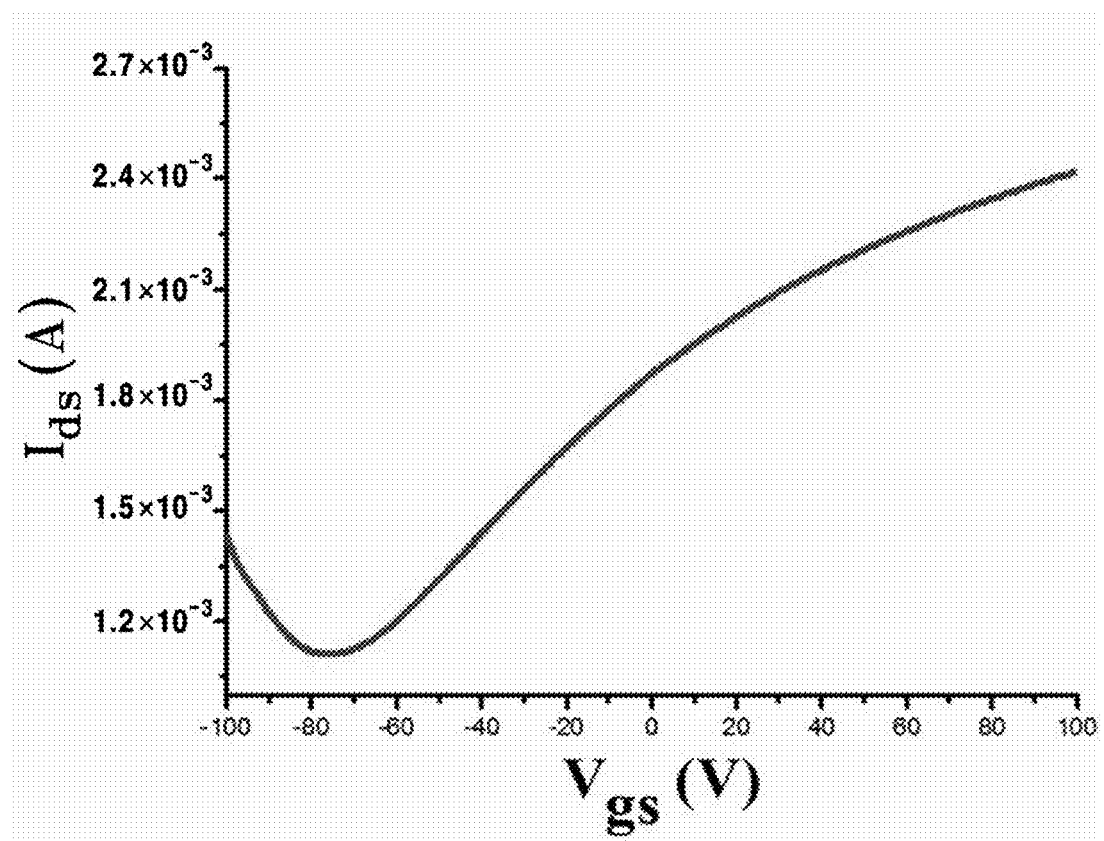

FIG. 7A is a transfer characteristic curve of the phosphorus-doped graphene channel left in the air, and FIG. 7B is a transfer characteristic curve obtained in vacuum.

As shown in FIGS. 7A and 7B, the phosphorus-doped graphene channel device exhibited a transfer characteristic curve that coincides with the transfer characteristic curve obtained in vacuum even after it was left in the air for about 30 days. That is, it was proven that the phosphorus-doped graphene channel device is capable of maintaining an N-type effect stably even in the air.

Accordingly, a field effect transistor manufactured by using a channel layer including the phosphorus-doped graphene in accordance with an example of the present disclosure exhibited a superior N-type semiconductor characteristic to that of a nitrogen-doped graphene semiconductor device which has been known as a good N-type graphene semiconductor device. Further, the field effect transistor using the channel layer including the phosphorus-doped graphene in accordance with the present disclosure showed high stability in the air for a long period of time.

As discussed above, the field effect transistor manufacture by using the channel layer including the phosphorus-doped graphene in accordance with the present disclosure exhibits excellent N-type semiconductor characteristics stable in the air. Thus, it is expected that this field effect transistor may contribute to the development of a complementary circuit graphene logical element in which a P-type semiconductor channel transistor and an N-type semiconductor channel transistor coexist.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A field effect transistor, comprising:
a source electrode and a drain electrode disposed on a substrate; and
a channel layer comprising a phosphorus-doped graphene, the channel layer electrically connected to the source electrode and the drain electrode, wherein the phosphorus-doped graphene is doped by substitution at an oxygen-binding site of the graphene with phosphorus, wherein the channel layer comprises a double layer of graphene with phosphorus between the double layers.

2. The field effect transistor of claim 1, further comprising an oxide film disposed between the substrate and the channel layer.

3. The field effect transistor of claim 1, wherein the channel layer is obtained by performing doping on a graphene material using one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_n PR_2$], diphosphene(HP=PH), diphosphenes(R—P=P—R), phosphine oxide($R_3P$=O), phosphorane($PR_5$, $R_3P$=$CR_2$), phosphinite[$P(OR)R_2$], phosphonite[$P(OR)_2R$], phosphate[$P(OR)_3$], phosphinate[$R_2P(RO)O$], phosphonate[$RP(RO)_2O$], phosphate[$P(RO)_3O$], and their combinations as a precursor.

4. The field effect transistor of claim 1, wherein the phosphorus-doped graphene comprises multiple layers.

5. The field effect transistor of claim 1, wherein a content of phosphorus in the phosphorus-doped graphene is 0.1 wt % or greater and 30 wt % or less.

6. The field effect transistor of claim 1, wherein the source electrode and the drain electrode independently include one selected from the group consisting of Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and their combinations.

7. The field effect transistor of claim 1, wherein the substrate comprises silicon, glass, or quartz.

8. The field effect transistor of claim 1, wherein the substrate comprises a flexible substrate, a transparent substrate, or a flexible and transparent substrate.

9. A method of producing a field effect transistor, comprising:
forming a source electrode and a drain electrode on a substrate;
forming a channel layer including a phosphorus-doped graphene, the channel layer electrically connected to the source electrode and the drain electrode, wherein the phosphorus-doped graphene is doped by substitution at an oxygen-binding site of the graphene with phosphorus,
the method further comprising doping a graphene material to obtain the phosphorus-doped graphene, wherein the doping is performed between double layers of a graphene film.

10. The method of claim 9, further comprising forming an oxide film on the substrate before forming the channel layer.

11. The method of claim 9, further comprising forming the channel layer by doping a graphene material with one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine($PH_3$), diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P=O$), phosphorane($PR_5$, $R_3P=CR_2$), phosphinite[$P(OR)R_2$], phosphonite[$P(OR)_2R$], phosphate[$P(OR)_3$], phosphinate[$R_2P(RO)O$], phosphonate[$RP(RO)_2O$], phosphate[$P(RO)_3O$], and their combinations as a precursor.

12. The method of claim 9, wherein the phosphorus-doped graphene comprises multiple layers.

13. The method of claim 9, wherein a content of phosphorus in the phosphorus-doped graphene is 0.1 wt % or greater and 30 wt % or less.

14. The method of claim 9, wherein the source electrode and the drain electrode independently include one selected from the group consisting of Au, Al, Ag, Be, Bi, Co, Cu, Cr, Hf, In, Mn, Mo, Mg, Ni, Nb, Pb, Pd, Pt, Rh, Re, Ru, Sb, Ta, Te, Ti, V, W, Zr, Zn, and their combinations.

15. The method of claim 9, wherein the substrate comprises silicon, glass, or quartz.

16. The method of claim 9, wherein the substrate comprises a flexible substrate or a transparent flexible substrate.

17. A method of preparing a phosphorus-doped graphene, comprising:
   injecting a precursor including a phosphorus compound into a graphene material, wherein the phosphorus compound is in a gas phase, a liquid phase, or a state of being dissolved in a solvent; and
   heating the precursor-injected graphene material,
   the method further comprising doping a graphene material to obtain the phosphorus-doped graphene, wherein the doping is performed between double layers of a graphene film.

18. The method of claim 17, wherein the graphene material comprises a graphene manufactured by chemical vapor deposition method, a graphene oxide, or a reduced graphene oxide.

19. The method of claim 17, wherein the phosphorus compound includes one selected from the group consisting of a triphenyl group-containing phosphorus compound, $P_4O_4$, $H_3PO_4$, $PF_3$, $PCl_3$, $PBr_3$, $PI_3$, $PF_5$, $PCl_5$, $PBr_5$, $PI_5$, phosphine ($PH_3$), diphosphane($H_2PPH_2$), diphosphine[$R_2PPR_2$, $R_2P(CH_2)_nPR_2$], diphosphene(HP=PH), diphosphenes(R—P=P—R), phosphine oxide($R_3P=O$), phosphorane($PR_5$, $R_3P=CR_2$), phosphinite[$P(OR)R_2$], phosphonite[$P(OR)_2R$], phosphate[$P(OR)_3$], phosphinate[$R_2P(RO)O$], phosphonate [$RP(RO)_2O$], phosphate[$P(RO)_3O$], and their combinations.

20. A phosphorus-doped graphene prepared by the method of claim 17.

21. The method of claim 17, further comprising shifting the Dirac point of the precursor-injected graphene material by thermal annealing.

22. The method of claim 17, wherein the injecting is adjusted such that the gate voltage of the pre-cursor injected graphene material is higher than the Dirac voltage of the pre-cursor injected graphene material.

23. The field effect transistor of claim 1, wherein the phosphorus-doped graphene is an annealed phosphorus-doped graphene.

24. The method of claim 9, wherein the phosphorus-doped graphene is an annealed phosphorus-doped graphene.

25. The method of claim 17, wherein the phosphorus-doped graphene comprises multiple layers.

* * * * *